(12) United States Patent
Chang et al.

(10) Patent No.: US 11,114,303 B2
(45) Date of Patent: Sep. 7, 2021

(54) GATE ALL AROUND DEVICE, METHOD FOR MANUFACTURING FINFET DEVICE, AND METHOD FOR MANUFACTURING GATE ALL AROUND DEVICE

(71) Applicant: TAIWAN SEMICONDUCTOR MANUFACTURING CO., LTD., Hsinchu (TW)

(72) Inventors: Kai-Tai Chang, Kaohsiung (TW); Tung-Ying Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 127 days.

(21) Appl. No.: 16/292,946

(22) Filed: Mar. 5, 2019

(65) Prior Publication Data

US 2020/0043742 A1 Feb. 6, 2020

Related U.S. Application Data

(60) Provisional application No. 62/712,227, filed on Jul. 31, 2018.

(51) Int. Cl.
| | |
|---|---|
| *H01L 27/12* | (2006.01) |
| *H01L 23/48* | (2006.01) |
| *H01L 21/4763* | (2006.01) |
| *H01L 21/44* | (2006.01) |
| *H01L 21/461* | (2006.01) |

(Continued)

(52) U.S. Cl.
CPC .... *H01L 21/3085* (2013.01); *H01L 21/02532* (2013.01); *H01L 21/02603* (2013.01); *H01L 21/3065* (2013.01); *H01L 21/76224* (2013.01); *H01L 21/823807* (2013.01); *H01L 21/823821* (2013.01); *H01L 21/823878* (2013.01); *H01L 27/0924* (2013.01); *H01L 27/10826* (2013.01); *H01L 27/10879* (2013.01);
(Continued)

(58) Field of Classification Search
CPC ........... H01L 27/0826; H01L 27/10879; H01L 27/41791; H01L 29/1037; H01L 29/42392; H01L 29/66742; H01L 29/66795; H01L 29/7851; H01L 29/78696; H01L 21/3085; H01L 21/02532; H01L 21/02603; H01L 21/76224; H01L 21/823807; H01L 21/823821; H01L 21/823878; H01L 27/0924; H01L 29/0649; H01L 29/0673
See application file for complete search history.

(56) References Cited

U.S. PATENT DOCUMENTS

| | | | |
|---|---|---|---|
| 8,866,254 B2 * | 10/2014 | Juengling | ......... H01L 29/66795 |
| | | | 257/506 |
| 9,093,530 B2 | 7/2015 | Huang et al. | |

(Continued)

*Primary Examiner* — Alonzo Chambliss
(74) *Attorney, Agent, or Firm* — Maschoff Brennan

(57) ABSTRACT

In a method, a semiconductor substrate is etched to form a trench, such that the trench defines a channel portion. A hard mask layer is deposited over sidewalls of the channel portion. The semiconductor substrate is anisotropically etched to deepen the trench, such that the deepened trench further defines a base portion under the channel portion and the hard mask layer. The hard mask layer is removed from the sidewalls of the channel portion. The deepened trench is filled with an isolation material. The isolation material is recessed to form an isolation structure, in which the channel portion protrudes from the isolation structure.

20 Claims, 30 Drawing Sheets

(51) Int. Cl.

| | |
|---|---|
| *H01L 21/311* | (2006.01) |
| *H01L 21/302* | (2006.01) |
| *H01L 21/308* | (2006.01) |
| *H01L 29/786* | (2006.01) |
| *H01L 21/8238* | (2006.01) |
| *H01L 21/762* | (2006.01) |
| *H01L 21/02* | (2006.01) |
| *H01L 21/3065* | (2006.01) |
| *H01L 29/66* | (2006.01) |
| *H01L 27/092* | (2006.01) |
| *H01L 29/06* | (2006.01) |
| *H01L 29/10* | (2006.01) |
| *H01L 29/423* | (2006.01) |
| *H01L 29/78* | (2006.01) |
| *H01L 29/417* | (2006.01) |
| *H01L 27/108* | (2006.01) |

(52) U.S. Cl.
CPC ...... *H01L 29/0649* (2013.01); *H01L 29/0673* (2013.01); *H01L 29/1037* (2013.01); *H01L 29/41791* (2013.01); *H01L 29/42392* (2013.01); *H01L 29/66742* (2013.01); *H01L 29/66795* (2013.01); *H01L 29/7851* (2013.01); *H01L 29/78696* (2013.01)

(56) References Cited

U.S. PATENT DOCUMENTS

| | | | |
|---|---|---|---|
| 9,171,929 B2 | 10/2015 | Lee et al. | |
| 9,209,247 B2 | 12/2015 | Colinge et al. | |
| 9,214,555 B2 | 12/2015 | Oxland et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,170,592 B2 * | 1/2019 | Ching | H01L 29/7848 |
| 10,679,950 B2 * | 6/2020 | Kuan | H01L 29/24 |
| 2010/0015778 A1 * | 1/2010 | Lin | H01L 21/823431 438/443 |
| 2011/0263094 A1 * | 10/2011 | Lin | H01L 21/76232 438/425 |
| 2015/0279971 A1 * | 10/2015 | Xie | H01L 29/66818 257/401 |
| 2016/0027903 A1 * | 1/2016 | Chang | H01L 21/76224 438/283 |
| 2016/0064288 A1 * | 3/2016 | Cheng | H01L 21/76224 257/192 |
| 2016/0141387 A1 * | 5/2016 | Tseng | H01L 29/66795 257/401 |
| 2016/0155670 A1 * | 6/2016 | Liaw | H01L 21/845 257/401 |
| 2018/0040713 A1 * | 2/2018 | Chang | H01L 27/0886 |
| 2019/0311955 A1 * | 10/2019 | Xu | H01L 21/76224 |

* cited by examiner

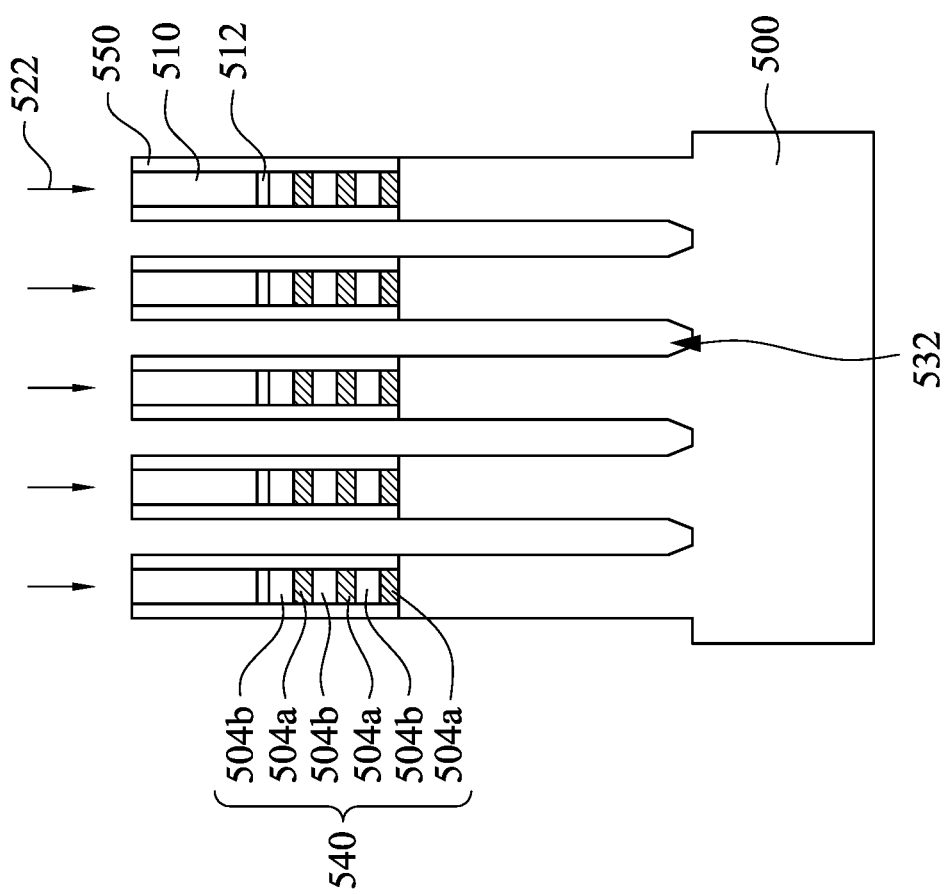

GATE ALL AROUND DEVICE, METHOD FOR MANUFACTURING FINFET DEVICE, AND METHOD FOR MANUFACTURING GATE ALL AROUND DEVICE

RELATED APPLICATIONS

This application claims priority to U.S. Provisional Application Ser. No. 62/712,227, filed Jul. 31, 2018, which is herein incorporated by reference.

BACKGROUND

The semiconductor integrated circuit (IC) industry has experienced rapid growth. In the course of IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. However, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, encountered with respect to both fabrication and design have resulted in the development of three-dimensional (3D) devices such as fin-like field effect transistors (FinFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A through FIG. 5H are schematic cross-sectional views of intermediate stages showing a method for manufacturing a semiconductor device in accordance with various embodiments of the present disclosure.

DETAILED DESCRIPTION

Figure 1:
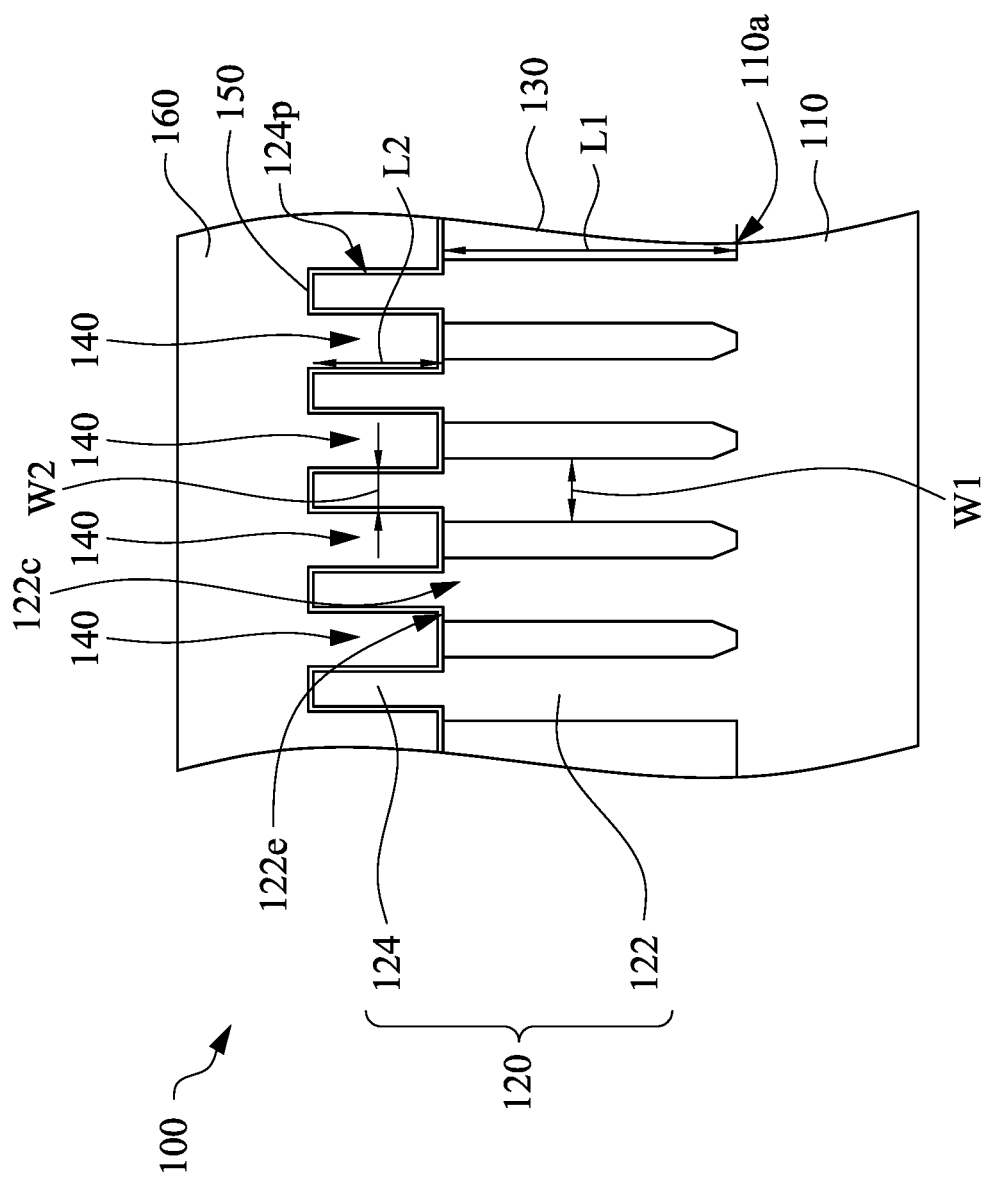
FIG. 1 is a schematic cross-sectional view of a semiconductor device in accordance with various embodiments of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. Terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the exchange of one term for another can be similarly performed and can be deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In a process for patterning protrusion structures, such as fins and nanowire structures, of a semiconductor device, profile control of the protrusion structures is very important. However, such profile control of the protrusion structures is difficult to achieve. For example, when a semiconductor substrate is etched to form a protrusion structure using a hard mask, the protrusion structure having a substantially straight profile is needed. If a ratio of an etch rate of the hard mask to an etch rate of the semiconductor substrate is too large, a great portion of the hard mask might be removed, thus decreasing a process window of a subsequent polishing process for manufacturing an isolation structure around the protrusion structure. When the ratio of the etch rate of the hard mask to the etch rate of the semiconductor substrate is too small, an etching pull back problem might occur on a sidewall of the protrusion structure, and thus the protrusion structure might not have the substantially straight profile.

Embodiments of the present disclosure are directed to providing a semiconductor device and a method for manufacturing the semiconductor device, in which two etching operations are used to form protrusion structures, and after channel portions of the protrusion structures are formed in a first etching operation, a hard mask layer is formed to cover sidewalls of the channel portions, such that lateral profiles of the channel portions are protected during a second etching operation. Thus, the channel portions having substantially straight profiles are achieved.

FIG. 1 is a schematic cross-sectional view of a semiconductor device in accordance with various embodiments of the present disclosure. In some embodiments, the semiconductor device 100 is a FinFET device. The semiconductor device 100 may include a semiconductor substrate 110, various protrusion structures 120, various shallow trench isolation (STI) structures 130, at least one gate dielectric layer 150, and at least one gate structure 160. The semiconductor substrate 110 may include a single-crystalline semiconductor material or a compound semiconductor material. For example, Si, Ge, SiGeSn, a III-V compound, $Si_xGe_{1-x}$, where 1>x>0, or the like may be used as a material of the semiconductor substrate 110. In some exemplary embodiments, the semiconductor substrate 110 includes silicon.

As shown in FIG. 1, the protrusion structures 120 are disposed over the semiconductor substrate 110. The protrusion structures 120 may be fins of a FinFET device. In some embodiments, the protrusion structures 120 are formed by etching the semiconductor substrate 110, such that the protrusion structures 120 protrude from a surface 110a of the semiconductor substrate 110. There are various trenches 140, each located between a corresponding adjacent two of the protrusion structures 120, such that the protrusion structures 120 are separated from each other. Each of the protrusion structures 120 includes a base portion 122 and a channel portion 124. The base portions 122 are disposed over the surface 110a of the semiconductor substrate 110. Each of the base portions 122 has a central portion 122c and two edge portions 122e, in which the edge portions 122e are located on opposite sides of the central portion 122c. Each of the base portions 122 has a width W1 and a length L1. In some exemplary embodiments, the width W1 of each of the base portions 122 is in a range from about 2 nm to about 30 nm, and the length L1 of each of the base portions 122 is in a range from about 5 nm to about 200 nm.

In each of the protrusion structures 120, the channel portion 124 is disposed over the central portion 122c of the base portion 122, such that each protrusion structure 120 has a stepped sidewall. The channel portions 124 are engaged with the gate structure 160. Each of the channel portions 124 may have a substantially straight profile 124p. Each of the channel portions 124 has a width W2 and a length L2, in which the width W1 of each base portion 122 is greater than the width W2 of each channel portion 124. Each of the protrusion structures 120 has a discontinuous portion between the channel portion 124 and the base portion 122. A difference between the width W1 of each base portion 122 and the width W2 of each channel portion 124 is in a rage from about 0.2 nm to about 20 nm. The width W2 of each channel portion 124 may be in a range from about 2 nm to about 30 nm, and the length L2 of each channel portion 124 may be in a range from about 5 nm to about 200 nm. In some embodiments, the length L1 of each of the base portions 122 is greater than the length L2 of each channel portion 124. If the width W1 of each base portion 122 is smaller than about 0.2 nm, current leakage might be occurred. If the width W2 of each channel portion 122 is smaller than about 0.2 nm, carrier mobility might be reduced. If the length L1 of each base portion 122 and/or the length L2 of each channel portion 124 is greater than about 200 nm, the protrusion structures 120 might be toppled down.

In some embodiments, the base portion 122 and the channel portions 124 of the protrusion structures 120 are formed by etching the semiconductor substrate 110, such that the semiconductor substrate 110 and the base portions 122 and the channel portions 124 of the protrusion structures 120 are made of the same material. For example, the base portions 122 and the channel portions 124 of the protrusion structures 120 may include Si, Ge, SiGeSn, a III-V compound, $Si_xGe_{1-x}$, where 1>x>0, or the like.

With continued reference to FIG. 1, the STI structures 130 are disposed over the surface 110a of the semiconductor substrate 110 between the base portions 122 of the protrusion structures 120. The trenches 140 are filled with an isolation material to form the STI structures 130. The STI structures 130 are respectively located between adjacent pairs of the base portions 122 of the protrusion structures 120 and cover sidewalls of the base portions 122. In some exemplary embodiments, the isolation material of the STI structures 130 includes silicon dioxide, silicon nitride, silicon oxynitride, or the like.

The gate dielectric layer 150 is disposed over the channel portions 124 and the base portions 122 of the protrusion structures 120 and the STI structures 130. The gate dielectric layer 150 covers sidewalls and top surfaces of the channel portions 124, top surfaces of the base portions 122, and top surfaces of the STI structures 130. In some embodiments, the gate dielectric layer 150 may include a high dielectric constant dielectric material. For example, $HfO_2$, $ZrO_2$, $TiO_2$, or the like may be used as a material of the gate dielectric layer 150.

The gate structure 160 is disposed over the gate dielectric layer 150. In some embodiments, the gate structure 160 includes a work function metal layer and an additional conductive layer, such as aluminum, tungsten, other suitable materials, or combinations thereof. The work function metal layer for an n-channel metal-oxide-semiconductor field-effect transistor (NMOSFET) may include tantalum, titanium aluminum, titanium aluminum nitride, other suitable materials, or combinations thereof. The work function metal layer for a p-channel metal-oxide-semiconductor field-effect transistor (PMOSFET) may include titanium nitride, tantalum nitride, other suitable materials, or combinations thereof.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 2:
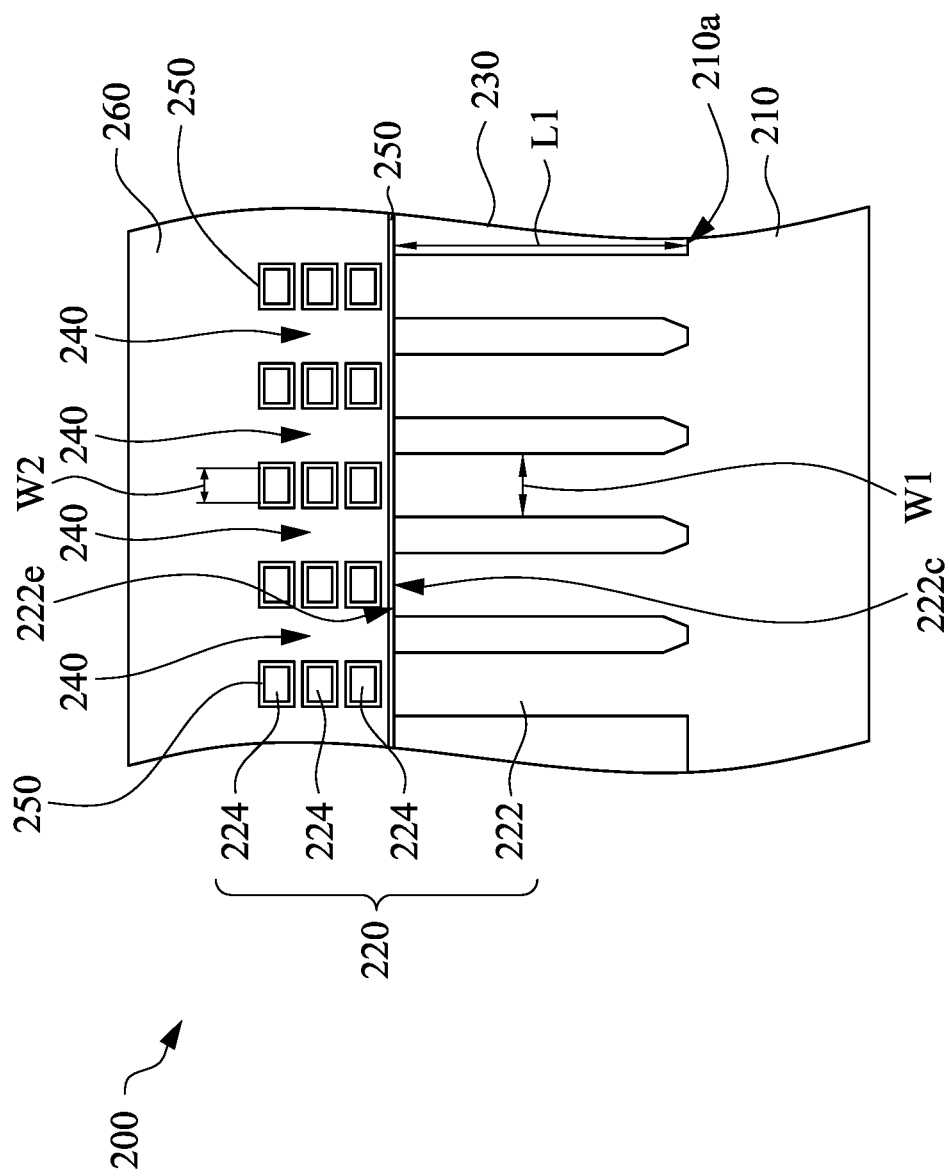
FIG. 2 is a schematic cross-sectional view of a semiconductor device in accordance with various embodiments of the present disclosure.

FIG. 2 is a schematic cross-sectional view of a semiconductor device in accordance with various embodiments of the present disclosure. In some embodiments, the semiconductor device 200 includes nanowire structures. The semiconductor device 200 may include a semiconductor substrate 210, various protrusion structures 220, various STI structures 230, various gate dielectric layers 250, and at least one gate structure 260. The semiconductor substrate 210 may include a single-crystalline semiconductor material or a compound semiconductor material. For example, the semiconductor substrate 210 may include Si, Ge, SiGeSn, a III-V compound, $Si_xGe_{1-x}$, where 1>x>0, or the like. In some exemplary embodiments, the semiconductor substrate 210 includes silicon.

As shown in FIG. 2, the protrusion structures 220 are disposed over the semiconductor substrate 210 and protrude from a surface 210a of the semiconductor substrate 210. There are various trenches 240, each located between a corresponding adjacent two of the protrusion structures 220 to separate the protrusion structures 220 from each other. Each of the protrusion structures 220 includes a base portion 222 and channel portions 224. The base portions 222 are disposed over the surface 210a of the semiconductor substrate 210. In some embodiments, the base portions 222 are formed by etching the semiconductor substrate 210, such that the base portions 222 protrude from the surface 210a of the semiconductor substrate 210, and the base portions 222 of the protrusion structures 220 and the semiconductor substrate 210 are made of the same material. For example, the base portions 222 may include Si, Ge, SiGeSn, a III-V compound, or $Si_xGe_{1-x}$, where 1>x>0, or the like. Each of the base portions 222 has a central portion 222c and two edge portions 222e, in which the edge portions 222e are located on opposite sides of the central portion 222c. Each of the base portions 222 has a width W1 and a length L1. In some exemplary embodiments, the width W1 of each of the base portions 222 is in a range from about 2 nm to about 30 nm, and the length L1 of each of the base portions 222 is in a range from about 5 nm to about 200 nm.

In each of the protrusion structures 220, the channel portions 224 are disposed over the central portion 222c of the base portion 222, and may be spaced from the base portion 222. Each of the channel portions 224 has a width W2, in which the width W1 of each base portion 222 is greater than the width W2 of each channel portion 224. A difference between the width W1 of each base portion 222 and the width W2 of each channel portion 224 is in a rage from about 0.2 nm to about 20 nm. The width W2 of each channel portion 224 may be in a range from about 2 nm to about 30 nm. In some embodiments, the channel portions 224, the base portions 222, and the semiconductor substrate 210 are made of the same material. In some other embodiments, a material of the channel portions 224 is different from a material of the base portions 222 and/or a material of the semiconductor substrate 210. For example, the channel portions 224 and the base portions 222 may include Si, Ge, SiGeSn, a III-V compound, $Si_xGe_{1-x}$, where 1>x>0, or the like.

As shown in FIG. 2, the STI structures 230 are disposed over the surface 210a of the semiconductor substrate 210 between the base portions 222 of the protrusion structures 220. The trenches 240 are filled with an isolation material to form the STI structures 230. The STI structures 230 are respectively located between adjacent pairs of the base portions 222 of the protrusion structures 220. The isolation material of the STI structures 230 may include silicon dioxide, silicon nitride, silicon oxynitride, or the like.

The gate dielectric layers 250 correspondingly wrap the channel portions 224. In some embodiment, one of the gate dielectric layers 250 is in contact with top surfaces of the base portions 222. In some embodiments, the gate dielectric layers 250 may include a high dielectric constant dielectric material. For example, the gate dielectric layers 250 may include $HfO_2$, $ZrO_2$, $TiO_2$, or the like.

The gate structure 260 wraps the gate dielectric layers 250 and is over top surfaces of the base portions 222 and top surfaces of the STI structures 230. A portion of the gate structure 260 is between the channel portions 224 and the base portions 222. The materials of the gate structure 260 are similar to that of the gate structure 160 of FIG. 1 and thus are not repeated herein.

Figure 3:
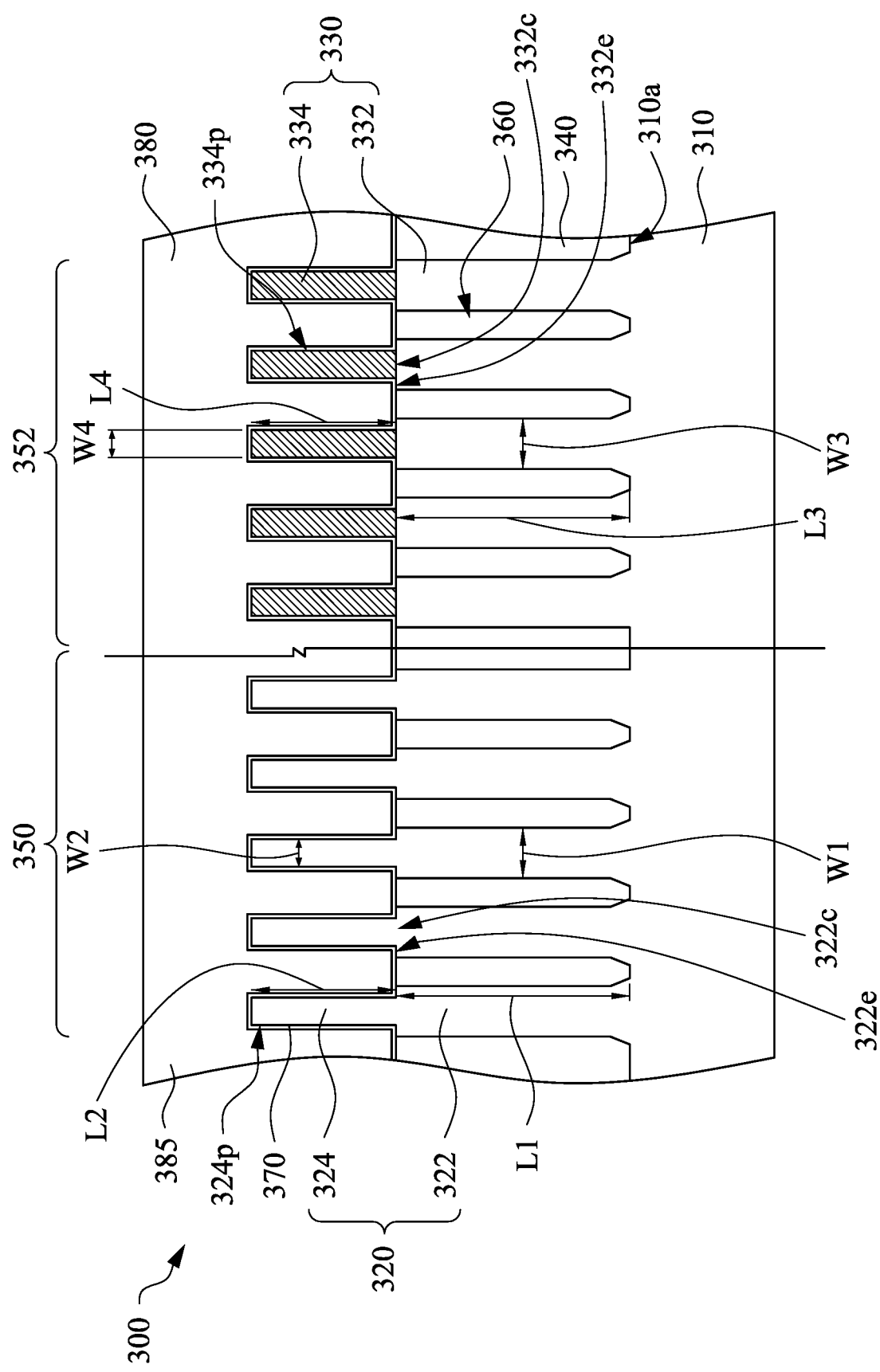
FIG. 3 is a schematic cross-sectional view of a semiconductor device in accordance with various embodiments of the present disclosure.

FIG. 3 is a schematic cross-sectional view of a semiconductor device in accordance with various embodiments of the present disclosure. In some embodiments, the semiconductor device 300 is a FinFET device. The semiconductor device 300 may include a semiconductor substrate 310, various protrusion structures 320 and 330, various STI structures 340, at least one gate dielectric layer 370, and first and second gate structures 380 and 385. The semiconductor substrate 310 may include a single-crystalline semiconductor material or a compound semiconductor material. For example, the semiconductor substrate 310 may include Si, Ge, SiGeSn, a III-V compound, $Si_xGe_{1-x}$, where 1>x>0, or the like. In some embodiments, the semiconductor substrate 310 includes silicon.

As shown in FIG. 3, the protrusion structures 320 and 330 are disposed over the semiconductor substrate 310 and protrude from a surface 310a of the semiconductor substrate 310. The protrusion structures 320 and 330 may be fins of a FinFET device. In some embodiments, the protrusion structures 320 and 330 are divided into a first group 350 and a second group 352, in which the protrusion structures 320 belong to the first group 350, and the protrusion structures 330 belong to the second group 352. The protrusion structures 320 in the first group 350 may be adjacent to each other, and the protrusion structures 330 in the second group 352 may be adjacent to each other. There are various trenches 360, each located between a corresponding adjacent two of the protrusion structures 320 and 330 to separate the protrusion structures 320 and 330 from each other. In some embodiments, the protrusion structures 320 are formed by etching the semiconductor substrate 310, such that the protrusion structures 320 protrude from the surface 310a of the semiconductor substrate 310. Each of the protrusion structures 320 includes a base portion 322 and a channel portion 324. The base portions 322 are disposed over the surface 310a of the semiconductor substrate 310. Each of the base portions 322 has a central portion 322c and two edge portions 322e, in which the edge portions 322e are located on opposite sides of the central portion 322c. Each of the base portions 322 has a width W1 and a length L1. For example, the width W1 of each base portion 322 is in a range from about 2 nm to about 30 nm, and the length L1 of each base portion 322 is in a range from about 5 nm to about 200 nm.

In each of the protrusion structures 320, the channel portion 324 is disposed over the central portion 322c of the base portion 322. The channel portions 324 are engaged with the second gate structure 385. Each of the channel portions 324 may have a substantially straight profile 324p. Each of the protrusion structures 320 has a discontinuous portion between the channel portion 324 and the base portion 322. Each of the channel portions 324 has a width W2 and a length L2, in which the width W1 of each base portion 322 is greater than the width W2 of each channel portion 324. A difference between the width W1 of each base portion 322 and the width W2 of each channel portion 324 is in a range from about 0.2 nm to about 20 nm. The width W2 of each channel portion 324 may be in a range from about 2 nm to about 30 nm, and the length L2 of each channel portion 324 may be in a range from about 5 nm to about 200 nm. In some embodiments, the protrusion structures 320 are formed by etching the semiconductor substrate 310, such that the semiconductor substrate 310 and the base portions 322 and the channel portions 324 of the protrusion structures 320 are made of the same material. For example, the base portions 322 and the channel portions 324 of the protrusion structures 320 may include Si, Ge, SiGeSn, a III-V compound, $Si_xGe_{1-x}$, where 1>x>0, or the like.

Each of the protrusion structures 330 includes a base portion 332 and a channel portion 334. The base portions 332 are disposed over the surface 310a of the semiconductor substrate 310. In some embodiments, the base portions 332 are formed by etching the semiconductor substrate 310, such that the base portions 332 protrude from the surface 310a of the semiconductor substrate 310, and the base portions 332 of the protrusion structures 330 and the semiconductor substrate 310 are made of the same material. For example, the base portions 332 may include Si, Ge, SiGeSn, a III-V compound, $Si_xGe_{1-x}$, where 1>x>0, or the like. Each of the base portions 332 has a central portion 332c and two edge portions 332e, in which the edge portions 332e are located on opposite sides of the central portion 332c. Each of the base portions 332 has a width W3 and a length L3. In some exemplary embodiments, the width W3 of each of the base portions 332 is in a range from about 2 nm to about 30 nm, and the length L3 of each of the base portions 332 is in a range from about 5 nm to about 200 nm.

In each of the protrusion structures 330, the channel portion 334 is disposed over the central portion 332c of the base portion 332. The channel portions 334 are engaged with the first gate structure 380. Each of the channel portions 334 may have a substantially straight profile 334p. Each of the protrusion structures 330 has a discontinuous portion between the channel portion 334 and the base portion 332. Each of the channel portions 334 has a width W4 and a length L4, in which the width W3 of each base portion 332 is greater than the width W4 of each channel portion 334. A difference between the width W3 of each base portion 332 and the width W4 of each channel portion 334 is in a rage from about 0.2 nm to about 20 nm. The width W4 of each channel portion 334 may be in a range from about 2 nm to about 30 nm, and the length L4 of each channel portion 334 may be in a range from about 5 nm to about 200 nm. In some embodiments, the channel portions 334 and the base portions 332 include different materials. In some exemplary embodiments, the channel portions 324 and the base portions 322 of the protrusion structures 320 and the base portions 332 of the protrusion structures 330 are made of a first material, and the channel portions 334 of the protrusion structures 330 include a second material different from the first material. For example, the first material and the second material may include Si, Ge, SiGeSn, a III-V compound, $Si_xGe_{1-x}$, where 1>x>0, or the like.

With continued reference to FIG. 3, the STI structures 340 are disposed over the surface 310a of the semiconductor substrate 310 between the protrusion structures 320 and 330. The trenches 360 are filled with an isolation material to form the STI structures 340. The STI structures 340 are respectively located between adjacent pairs of the base portions 322 of the protrusion structures 320 and the base portions 332 of the protrusion structures 330. The STI structures 340 may include silicon dioxide, silicon nitride, silicon oxynitride, or the like.

The gate dielectric layer 370 is disposed over the channel portions 324 and 334, the base portions 322 and 332, and the STI structures 340. The gate dielectric layer 370 covers sidewalls and top surfaces of the channel portions 324 and 334, top surfaces of the base portions 322 and 332, and top surfaces of the STI structures 340. In some embodiments, the gate dielectric layer 370 may include a high dielectric constant dielectric material. For example, the gate dielectric layer 370 may include $HfO_2$, $ZrO_2$, $TiO_2$, or the like. In some other embodiments, two gate dielectric layers having different materials may be respectively disposed over the channel portions 324 and the channel portions 334.

First and second gate structures 380 and 385 are disposed respectively over the channel portions 334 and the channel portions 324. The first and second gate structures 380 and 385 may each include a work function metal layer and an additional conductive layer, such as aluminum, tungsten, other suitable materials, or combinations thereof. The work function metal layer for an NMOSFET may include tantalum, titanium aluminum, titanium aluminum nitride, other suitable materials, or combinations thereof. The work function metal layer for a PMOSFET may include titanium nitride, tantalum nitride, other suitable materials, or combinations thereof. In some embodiments, the first gate structure 380 includes a p-type work function material layer, and the second gate structure 385 includes an n-type work function material layer. That is, the first gate structure 380 is configured for a PMOSFET, and the second gate structure 385 is configured for an NMOSFET.

Figure 4A:
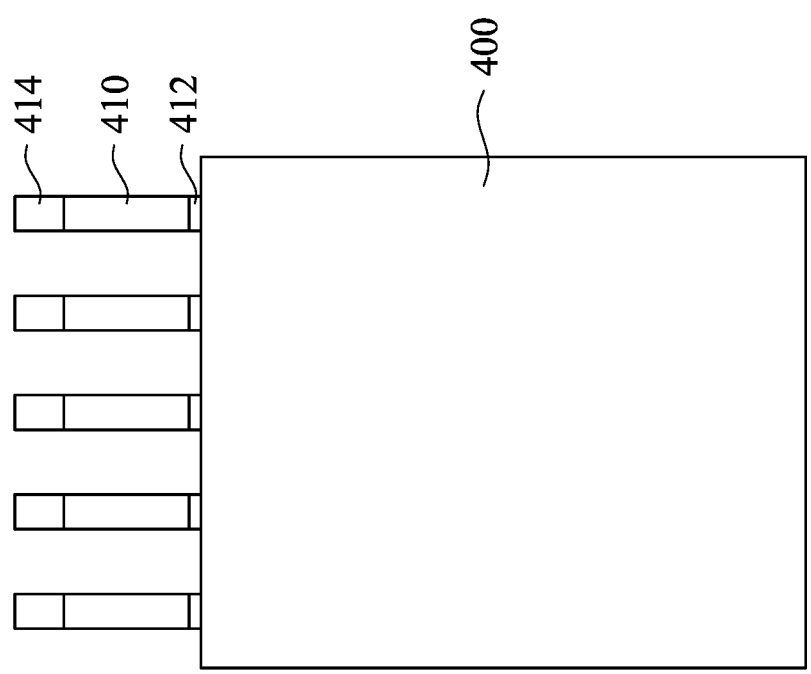
FIG. 4A through FIG. 4I are schematic cross-sectional views of intermediate stages showing a method for manufacturing a semiconductor device in accordance with various embodiments of the present disclosure.

FIG. 4A through FIG. 4I are schematic cross-sectional views of intermediate stages showing a method for manufacturing a semiconductor device in accordance with various embodiments of the present disclosure. As shown in FIG. 4A, a semiconductor substrate 400 is provided. The semiconductor substrate 400 may include a single-crystalline semiconductor material, a compound semiconductor material, or the like. For example, the semiconductor substrate 400 may include Si, Ge, SiGeSn, a III-V compound, $Si_xGe_{1-x}$, where 1>x>0, or the like.

In some embodiments, a patterned hard mask 410 is formed over the semiconductor substrate 400. The patterned hard mask 410 is used to define the semiconductor substrate 400. The patterned hard mask 410 and the semiconductor substrate 400 include different materials, and the patterned hard mask 410 has an etch selectivity with respect to the semiconductor substrate 400. For example, the patterned hard mask 410 may include $Al_2O_3$, SiCN, $SiN_x$, where x>0, or the like.

With continued reference to FIG. 4A, in some embodiments, a patterned buffer layer 412 is formed over the semiconductor substrate 400. In the embodiments, the patterned hard mask 410 is formed over the patterned buffer layer 412, such that the patterned buffer layer 412 is sandwiched between the patterned hard mask 410 and the semiconductor substrate 400 for increasing adhesion between the patterned hard mask 410 and the semiconductor substrate 400. In some embodiments, a patterned protective layer 414 is formed over the patterned hard mask 410 to protect the patterned hard mask 410. The patterned protective layer 414 and the patterned hard mask 410 include different materials. For example, the patterned protective layer 414 may include $Al_2O_3$, SiCN, $SiN_x$, where x>0, or the like.

In some exemplary embodiments, the buffer layer is blanketly formed over the semiconductor substrate 400 by using, for example, thermal oxidation, chemical vapor deposition (CVD), or the like. The hard mask is formed over the buffer layer by using, for example, CVD, physical vapor deposition (PVD), or the like. The protective layer is formed over the hard mask by using, for example, CVD, PVD, or the like. Next, a patterning process is performed to remove portions of the protective layer, the hard mask, and the buffer layer by using, for example, photolithography and etching operations, so as to form the patterned buffer layer 412, the patterned hard mask 410, and the patterned protective layer 414 stacked over the semiconductor substrate 400 in sequence. The etching operation may be any acceptable etching operation, such as a reactive ion etching (RIE) operation, a neutral beam etching (NBE) operation, the like, or combinations thereof. In some embodiments, the etching operation may be anisotropic. In some exemplary embodiments, the patterned hard mask 410 is thicker than the patterned buffer layer 412 and the patterned protective layer 414.

Figure 4B:
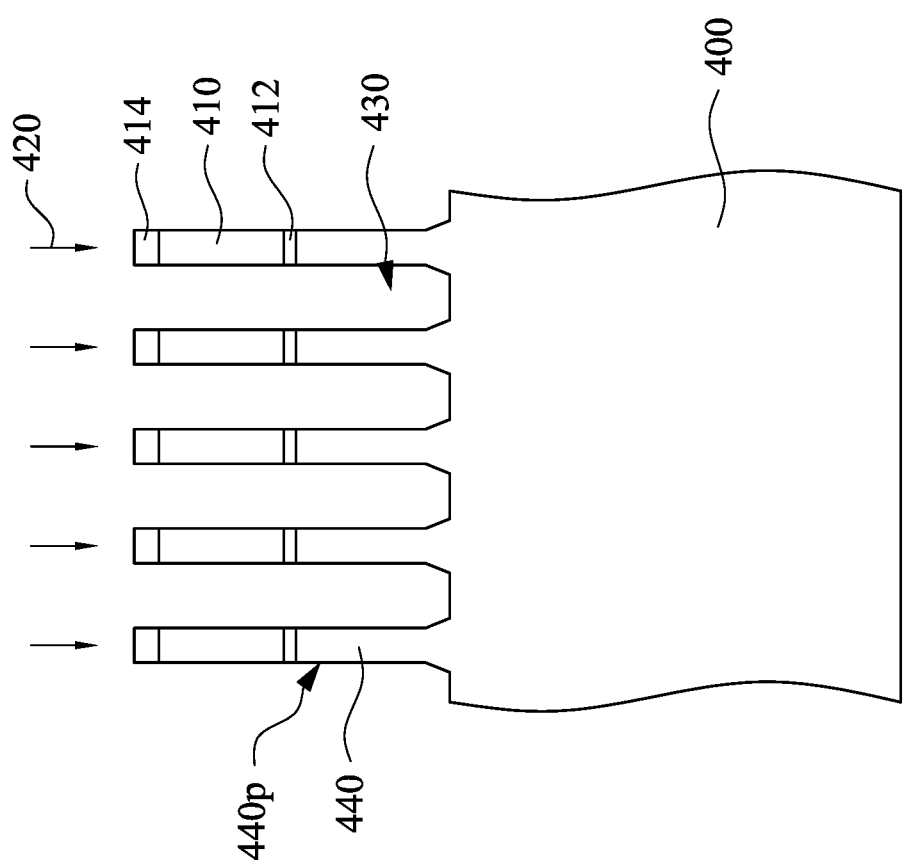

As shown in FIG. 4B, a first etching operation 420 is performed on the semiconductor substrate 400. The first etching operation 420 removes portions of the semiconductor substrate 400 to form various first trenches 430 in the semiconductor substrate 400, thereby defining various channel portions 440. The first etching operation 420 may be any acceptable etching operation, such as an RIE operation, an NBE operation, the like, or combinations thereof. In some embodiments, the first etching operation 420 may be an anisotropic etching operation.

Figure 4C:
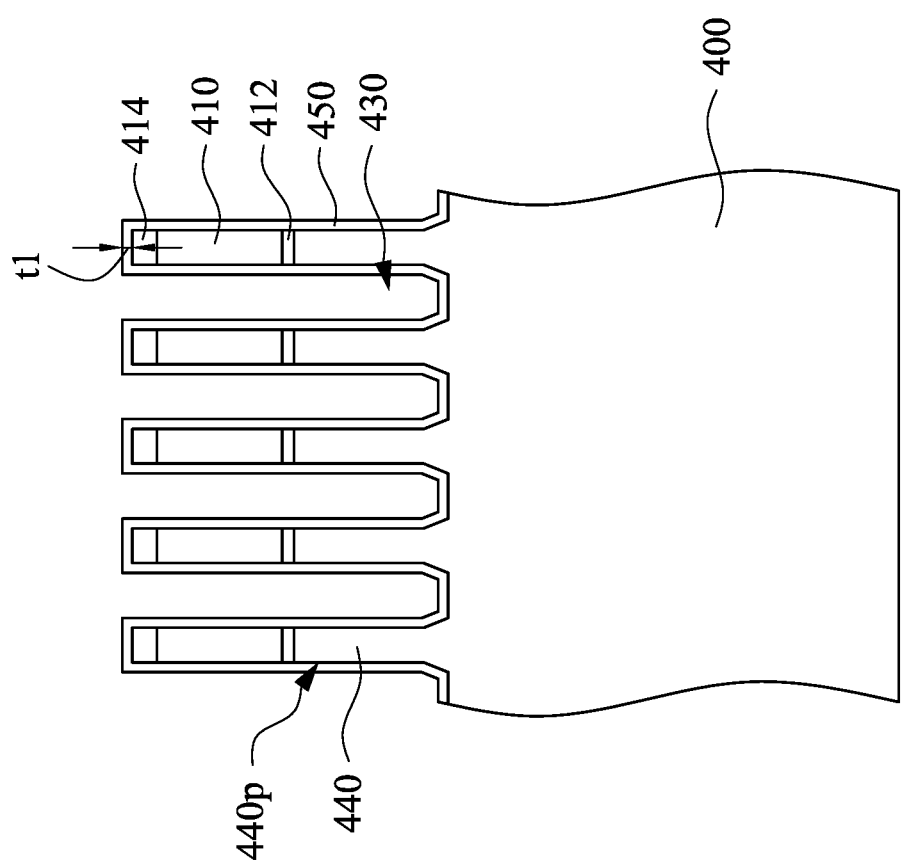

As shown in FIG. 4C, a hard mask layer 450 is formed conformally over the patterned protective layer 414, the patterned hard mask 410, the patterned buffer layer 412, and the semiconductor substrate 400, such that the hard mask layer 450 is over a bottom of each first trench 430. The hard mask layer 450 is formed over sidewalls of the channel portions 440 to protect the sidewalls of the channel portions 440 from being etched by the following second etching operation 422 (see FIG. 4D). In some embodiments, the hard mask layer 450 may be formed by using atomic layer deposition (ALD). In some alternative embodiments, plasma-enhanced chemical vapor deposition (PECVD), remote plasma-enhanced chemical vapor deposition (RPCVD), or the like may also be used to form the hard mask layer 450. A process temperature of forming the hard mask layer 450 may be controlled in a range substantially from 0 degrees centigrade to 500 degrees centigrade. The hard mask layer 450 may be formed by using an ex-situ method, that is, the hard mask layer 450 may be formed in a chamber other than the chamber in which the first etching operation 420 is performed.

In some embodiments, the hard mask layer 450 may be formed by using an in-situ method, that is, the first etching operation 420 and forming the hard mask layer 450 may be performed in the same chamber. In some exemplary embodiments, a thickness t1 of the hard mask layer 450 is in a range from about 0.1 nm to about 10 nm. If the thickness t1 of the hard mask layer 450 is smaller than about 0.1 nm, the hard mask layer 450 might be too thin to protect the sidewalls of the channel portions 440 from being etched. If the thickness t1 of the hard mask layer 450 is greater than about 10 nm, the first trenches 430 might be closed by the hard mask layer 450.

In some exemplary embodiments, the hard mask layer 450 has an etch selectivity with respect to the patterned hard mask 410. An etch rate of the hard mask layer 450 during the following second etching operation 422 (see FIG. 4D) is lower than an etch rate of the patterned hard mask 410 during the following second etching operation 422 (see FIG. 4D). For example, the hard mask layer 450 may include $SiO_2$, metal oxide, or the like.

Figure 4D:
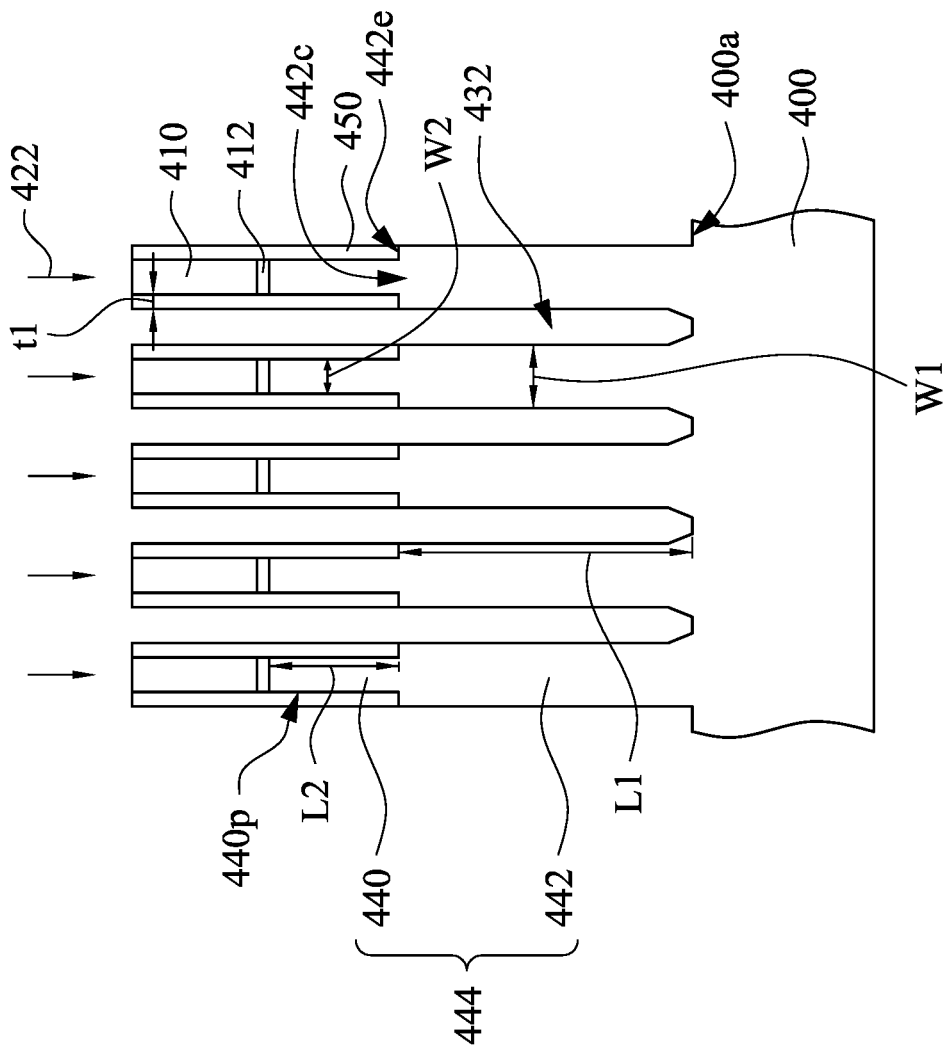

As shown in FIG. 4D, a second etching operation 422 is performed on the hard mask layer 450 and bottoms of the first trenches 430 to removes portions of the hard mask layer 450 and portions of the semiconductor substrate 400, so as to respectively deepen the first trenches 430 to be formed as various second trenches 432. In the second etching operation 422, prior to etching the semiconductor substrate 400, the hard mask layer 450 over the bottoms of the first trenches 430 is etched. After the second etching operation 422 is performed, the semiconductor substrate 400 is formed to have various base portions 442, in which the base portions 442 are separated from each other by the second trenches 432. The semiconductor substrate 400 is etched, such that a top surface of each base portion 442 is in contact with a bottom surface of the hard mask layer 450.

Each of the base portions 442 has a central portion 442c and two edge portions 442e, in which the edge portions 442e are located on opposite sides of the central portion 442c. The channel portions 440 are respectively located over the central portions 442c of the base portions 442 to correspondingly form protrusion structures 444. The remaining portions of the hard mask layer 450 are respectively located over the edge portions 442e of the base portions 442. Thus, in each of the protrusion structures 444, a width W1 of the base portion 442 is greater than a width W2 of the channel portion 440, and a difference between the width W1 of the base portion 442 and the width W2 of the channel portion 440 is substantially two times the thickness t1 of the hard mask layer 450. That is, the difference between the width W1 of the base portion 442 and the width W2 of the channel portion 440 is in a rage from about 0.2 nm to about 20 nm.

For example, the width W1 of each base portion 442 may be in a range from about 2 nm to about 30 nm, and the width W2 of each channel portion 440 may be in a range from about 2 nm to about 30 nm. Each of the base portions 442 has a length L1, and each of the channel portions 440 has a length L2. For example, the length L1 of each of the base portions 442 may be in a range from about 5 nm to about 200 nm, and the length L2 of each channel portion 440 may be in a range from about 5 nm to about 200 nm. In some embodiments, the protrusion structures 444 are formed by etching the semiconductor substrate 400, such that the protrusion structures 444 protrude from a surface 400a of the semiconductor substrate 400. In some exemplary embodiments, the semiconductor substrate 400 is a single-layered structure, such that the semiconductor substrate 400 and the channel portions 440 and the base portions 442 of the protrusion structures 444 are made of the same material.

The patterned protective layer 414 (see FIG. 4C) may be removed during the second etching operation 422, such that a top of the patterned hard mask 410 is exposed. In some certain embodiments, portions of the patterned hard mask 410 may be removed during the second etching operation 422. The remaining portions of the hard mask layer 450 respectively cover the sidewalls of each of the channel portions 440, as well as sidewalls of the patterned hard mask 410 and the patterned buffer layer 412 corresponding to the each of the channel portions 440. The second etching operation 422 may be any acceptable etching operation, such as an RIE operation, an NBE operation, the like, or combinations thereof. In some embodiments, the second etching operation 422 may be anisotropic. The second etching operation 422 may be performed by using an ex-situ method, that is, the second etching operation 422 may be performed in a chamber other than the chamber in which the hard mask layer 450 is formed. The second etching operation 422 may be performed by using an in-situ method, that is, the second etching operation 422 and forming the hard mask layer 450 may be performed in the same chamber.

In some embodiments, the etch rate of the hard mask layer 450 during the second etching operation 422 is lower than the etch rate of the patterned hard mask 410 during the second etching operation 422. Since the hard mask layer 450 is harder to be etched by the second etching operation 422 than the patterned hard mask 410, the sidewalls of the channel portions 440 are well protected by the hard mask layer 450 during the second etching operation 422, such that the profile 440p of each of the channel portions 440 is kept intact, thereby forming each of the channel portions 440 having the substantially straight profile 440p. Moreover, the rate of the second etching operation 422 can also be increased without concern about damaging the sidewalls of the channel portions 440, thus reducing an operation time of the second etching operation 422.

Figure 4E:
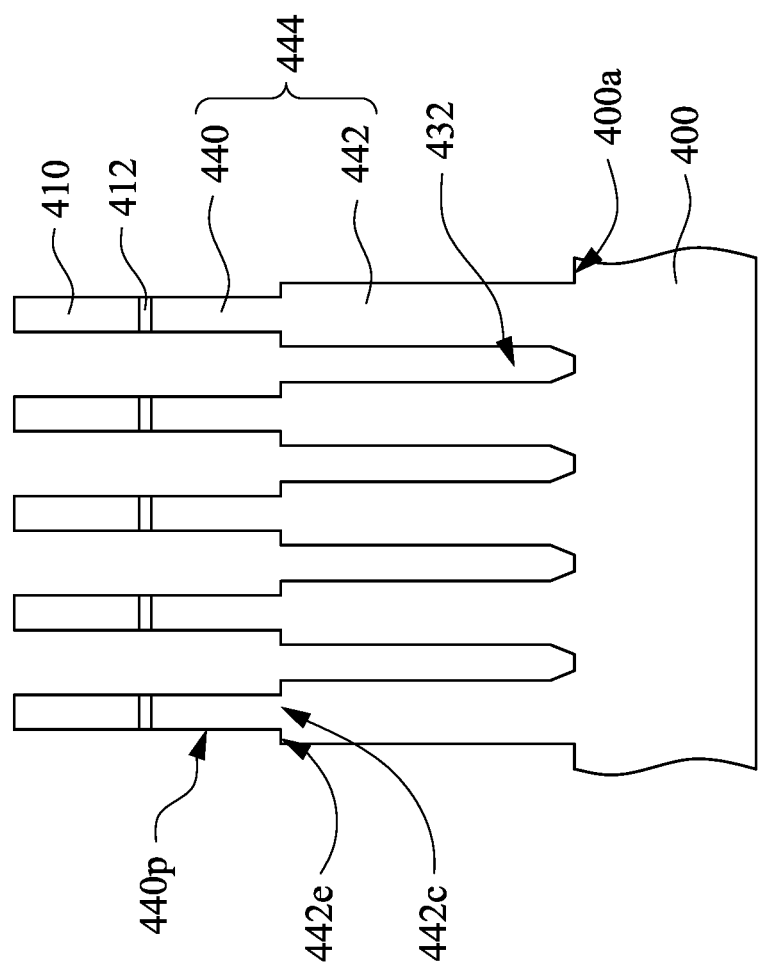

In some embodiments, as shown in FIG. 4E, the remaining portions of the hard mask layer 450 are removed to expose the sidewalls of the channel portions 440, and of the patterned hard mask 410 and the patterned buffer layer 412 corresponding to the each of the channel portions 440. The remaining portions of the hard mask layer 450 may be removed by using, for example, a dry etch technique or a wet etch technique.

Figure 4F:
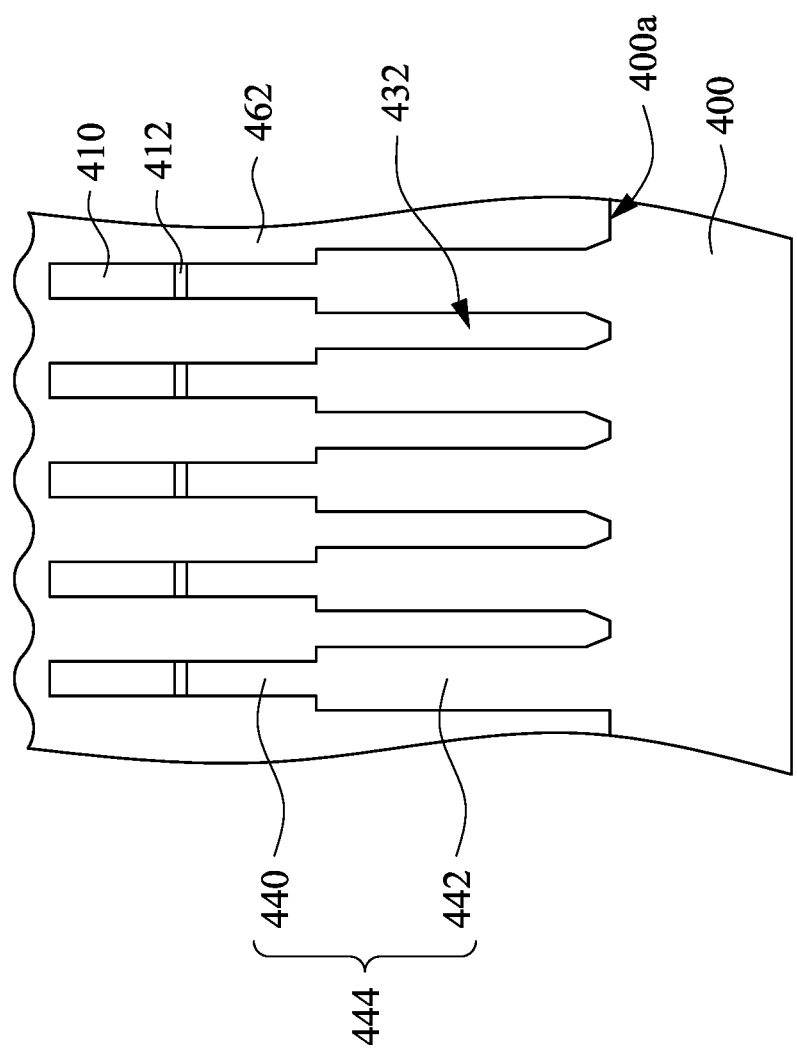
Figure 4G:
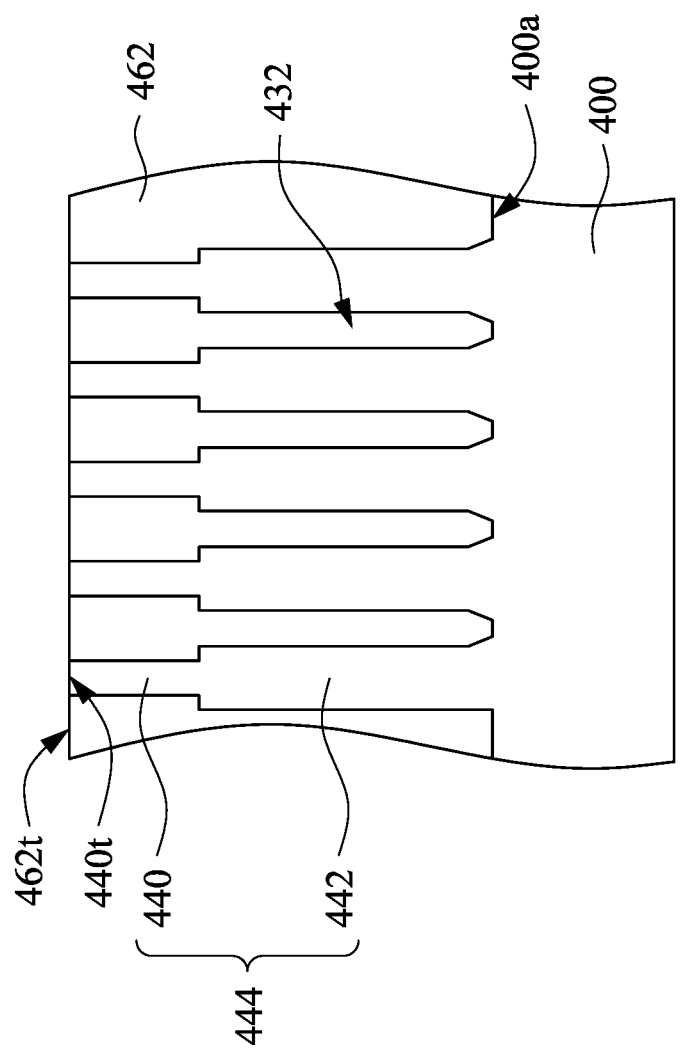
Figure 4H:
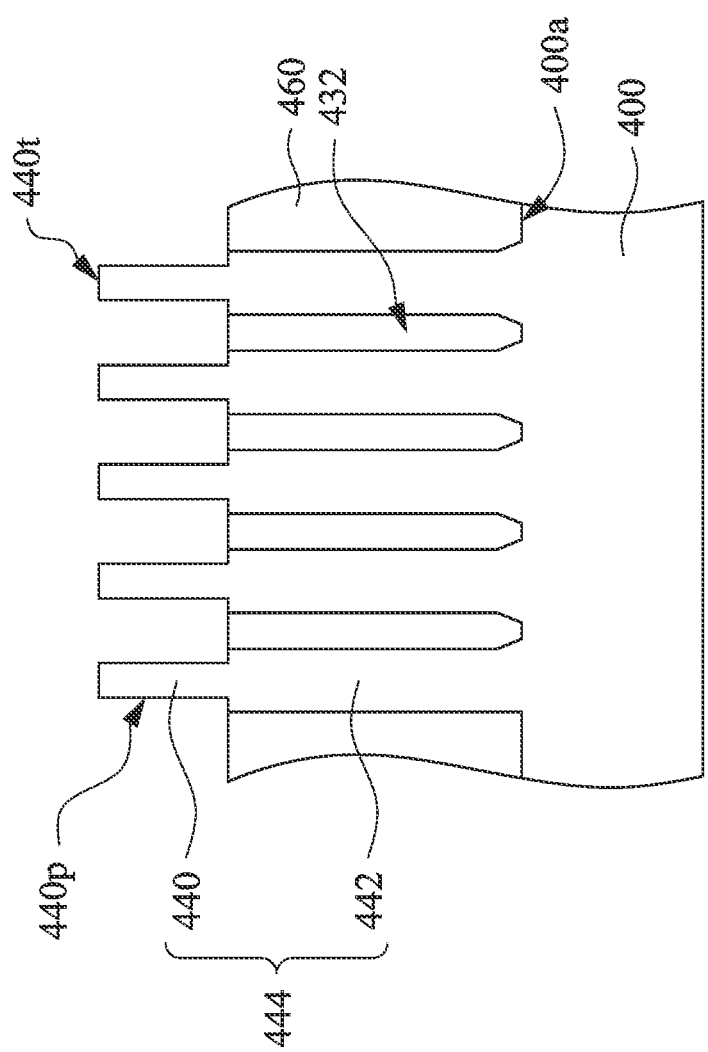

After the protrusion structures 444 are formed, STI structures 460 are formed in the second trenches 432 and cover sidewalls of the base portions 442 (see FIG. 4H). In some embodiments, referring to FIG. 4F through FIG. 4H, in forming the STI structures 460, an isolation material layer 462 is formed over the semiconductor substrate 400, the protrusion structures 444, the patterned hard mask 410, and the patterned buffer layer 412 by using, for example, CVD, PECVD, or the like. As shown in FIG. 4F, the second trenches 432 are filled with the isolation material layer 462. The isolation material layer 462 includes a dielectric material, such as silicon dioxide, silicon nitride, silicon oxynitride, or the like. In some exemplary embodiments, the isolation material layer 462 may be annealed.

As shown in FIG. 4G, a planarization process may be performed on the isolation material layer 462 to remove a portion of the isolation material layer 462, the patterned hard mask 410 and the patterned buffer layer 412 to expose top surfaces 440t of the channel portions 440. After the planarization process is performed, a top surface 462t of the isolation material layer 462 is substantially at the same level with the top surfaces 440t of the channel portions 440. In some exemplary embodiments, the planarization process is performed by a polishing method, such as a chemical mechanical polishing (CMP) method.

As shown in FIG. 4H, the isolation material layer 462 is recessed to expose the sidewalls of the channel portions 440, so as to form the STI structures 460. In some embodiments, the isolation material layer 462 is recessed by using, for example, dry etching.

After the STI structures 460 are formed, various operations are performed to form the semiconductor device. In some embodiments, the operations includes formation of a dummy gate stack over the channel portions 440, formation of lightly doped drain (LDD) regions in the protrusion structures 444, formation of gate spacers alongside the dummy gate stack, formation of source and drain structures adjacent to the gate spacers, formation of a contact etch stop layer (CESL), and formation of an interlayer dielectric (ILD) layer.

Figure 4I:
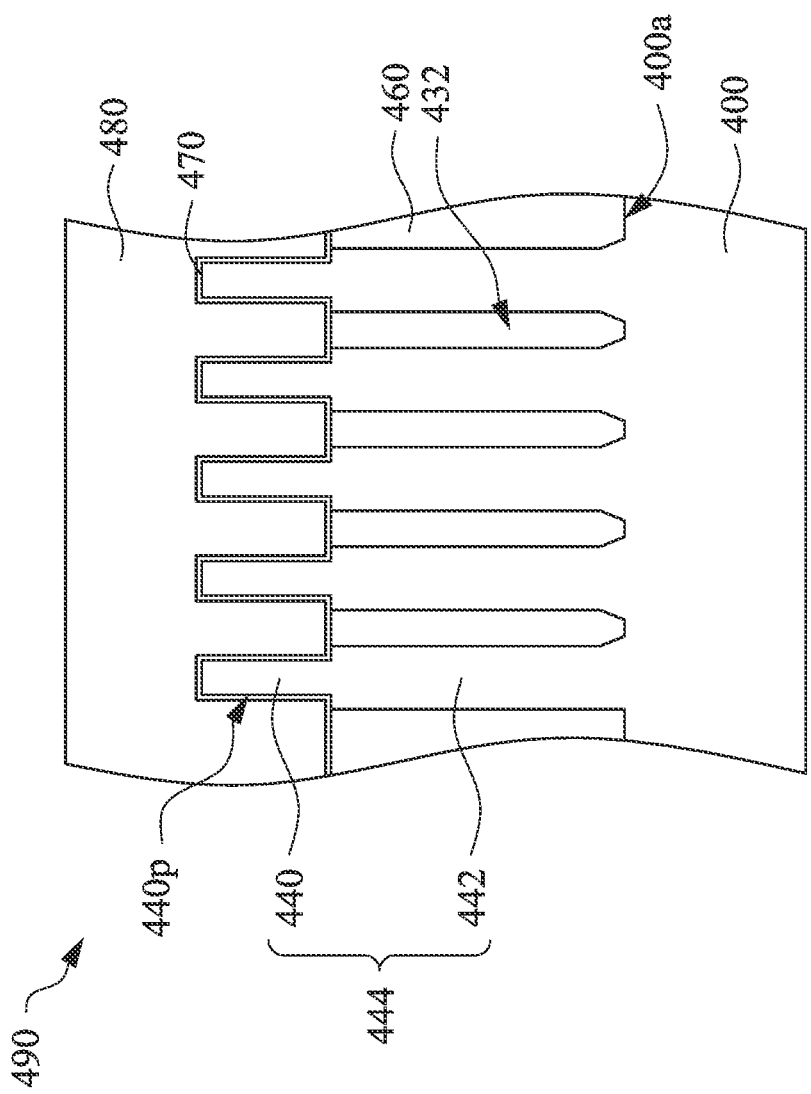

After the ILD layer is formed, the dummy gate stack is removed. As shown in FIG. 4I, a gate dielectric layer 470 is formed over the sidewalls and the top surfaces of the channel portions 440 of the protrusion structures 444. In some embodiments, formation of the gate dielectric layer 470 includes thermal oxidation, CVD, PECVD, LPCVD, the like, or combinations thereof. In some exemplary embodiments, the gate dielectric layer 470 may include a high dielectric constant dielectric material. For example, the gate dielectric layer 470 may include $HfO_2$, $ZrO_2$, $TiO_2$, the like, or combinations thereof.

A gate structure 480 is formed over the gate dielectric layer 470 so as to substantially complete the semiconductor device 490. In some embodiments, formation of the gate structure 480 may include CVD, PVD, ALD, plating, other suitable processes, and/or combinations thereof. In some embodiments, the gate structure 480 may include a work function metal layer and an additional conductive layer, such as aluminum, tungsten, other suitable materials, or combinations thereof. The work function metal layer for an NMOSFET may include tantalum, titanium aluminum, titanium aluminum nitride, other suitable materials, or combinations thereof. The work function metal layer for a PMOSFET may include titanium nitride, tantalum nitride, other suitable materials, or combinations thereof. After the work function metal layer and the conductive layer are formed, a CMP process may then be performed to planarize the semiconductor device 490.

Figure 5A:
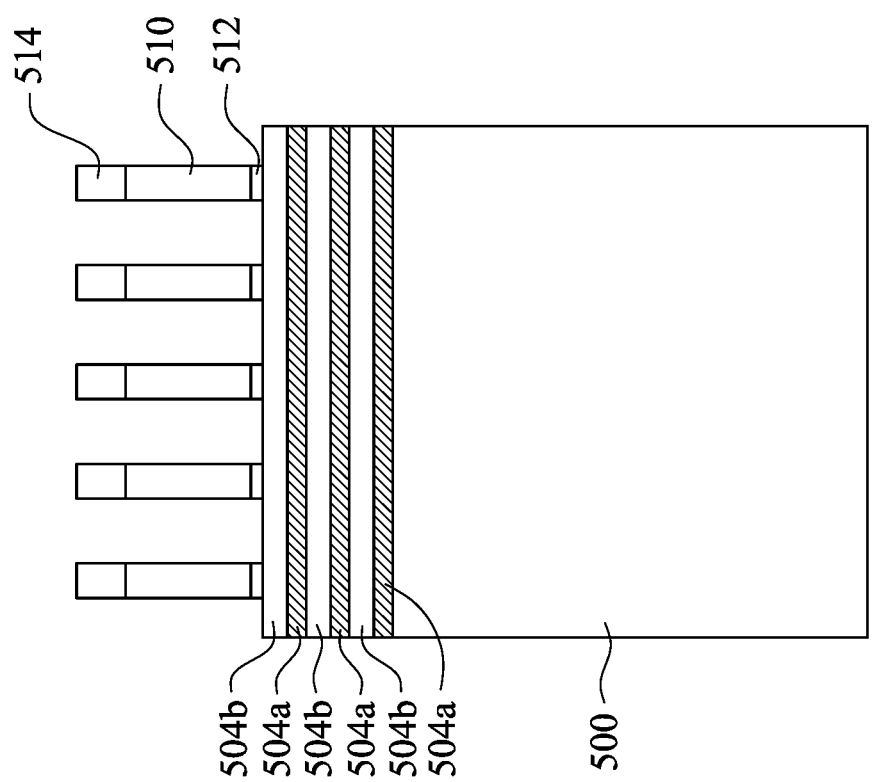

FIG. 5A through FIG. 5H are schematic cross-sectional views of intermediate stages showing a method for manufacturing a semiconductor device in accordance with various embodiments of the present disclosure. As shown in FIG. 5A, a semiconductor substrate 500 is provided. The semiconductor substrate 500 may include a single-crystalline semiconductor material or a compound semiconductor material. For example, the semiconductor substrate 500 may include Si, Ge, SiGeSn, a III-V compound, $Si_xGe_{1-x}$, where $1>x>0$, or the like.

In some exemplary embodiments, first films 504a and second films 504b are alternately stacked over the semiconductor substrate 500 in sequence. For example, the first films 504a and the second films 504b may be epitaxially grown over the semiconductor substrate 500. The first films 504a and the second films 504b include different materials. For example, the first films 504a may include $SiGe_x$, Ge, or the like, and the second films 504b may include Si or the like. In some embodiments, the first films 504a and the semiconductor substrate 500 include different materials, and the second films 504b and the semiconductor substrate 500 are made of the same material. In some embodiments, the second films 504b and the semiconductor substrate 500 include different materials as well. For example, the first films 504a and the second films 504b may include Si, Ge, SiGeSn, a III-V compound, $Si_xGe_{1-x}$, where $1>x>0$, or the like.

In some embodiments, a patterned buffer layer 512, a patterned hard mask 510, and a patterned protective layer 514 are formed over a top one of the first and second films 504a and 504b. Formation of the patterned buffer layer 512, the patterned hard mask 510, and the patterned protective layer 514 is similar to that of the patterned buffer layer 412, the patterned hard mask 410, and the patterned protective layer 414 of FIG. 4A and thus is not repeated herein.

Figure 5B:
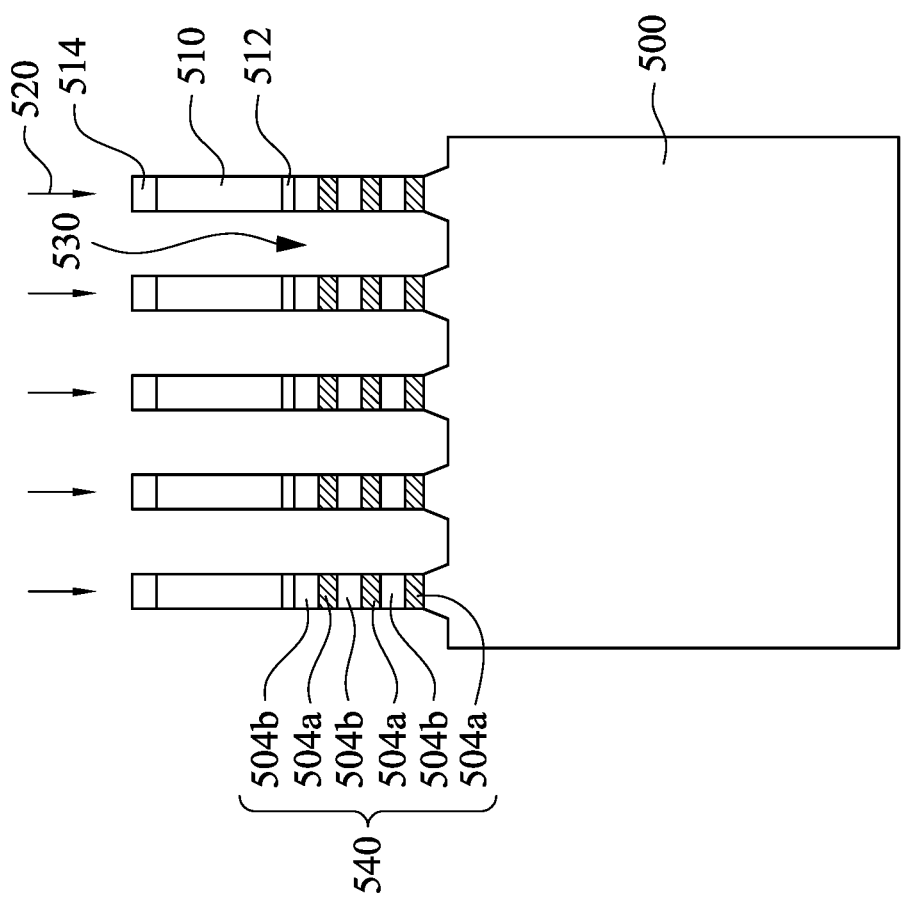

As shown in FIG. 5B, a first etching operation 520 is performed on the first films 504a, the second films 504b, and the semiconductor substrate 500. The first etching operation 520 is performed to remove portions of the first films 504a, the second films 504b, and the semiconductor substrate 500 to form various first trenches 530, thereby defining various channel portions 540. Each of the channel portions 540 includes the first films 504a and the second films 504b alternately stacked over the semiconductor substrate 500. This first etching operation 520 may be performed in a similar manner as described in the first etching operation 420 of FIG. 4B, and is not repeated herein.

Figure 5C:
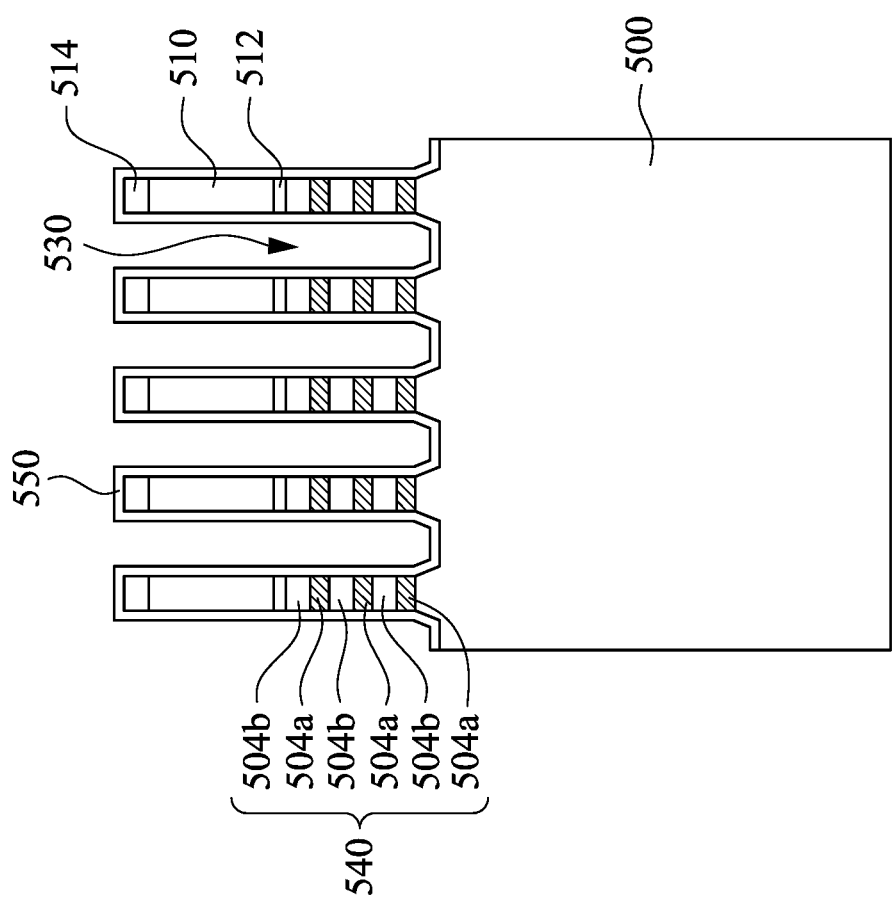

As shown in FIG. 5C, a hard mask layer 550 is formed conformally over the patterned protective layer 514, the patterned hard mask 510, the patterned buffer layer 512, the channel portions 540, and the semiconductor substrate 500. The hard mask layer 550 is formed over sidewalls of the channel portions 540 to protect the sidewalls of the channel portions 540 from being etched by the following second etching operation 522 (see FIG. 5D). The structural details and formation of the hard mask layer 550 are similar to that of the hard mask layer 450 of FIG. 4C and thus are not repeated herein.

As shown in FIG. 5D, a second etching operation 522 is performed on the hard mask layer 550 and bottoms of the first trenches 530 to remove portions of the hard mask layer 550 and portions of the semiconductor substrate 500, so as to respectively deepen the first trenches 530 to be formed as various second trenches 532. In the second etching operation 522, prior to etching the semiconductor substrate 500, the hard mask layer 550 over the top surface of the semiconductor substrate 500 is etched. This second etching operation 522 may be performed in a similar manner as described in the second etching operation 422 of FIG. 4D, and is not repeated herein.

Figure 5E:
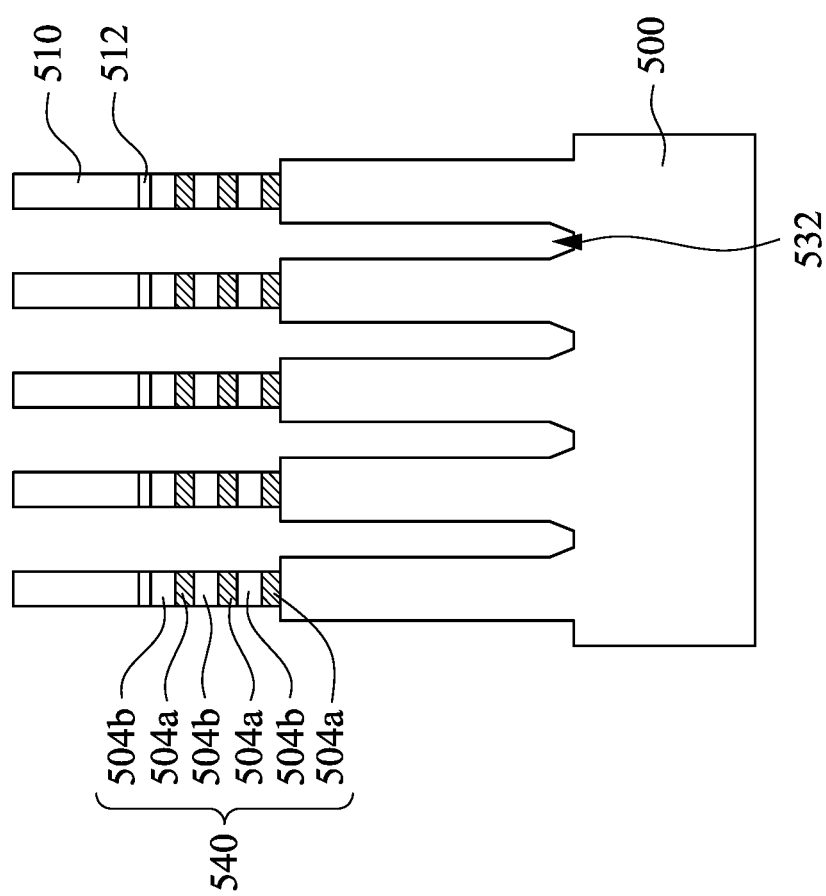

In some embodiments, as shown in FIG. 5E, the remaining portions of the hard mask layer 550 are removed to expose the sidewalls of the channel portions 540, and of the patterned hard mask 510 and the patterned buffer layer 512 corresponding to the each of the channel portions 540. The remaining portions of the hard mask layer 550 may be removed by using, for example, a dry etch method or a wet etch method.

Figure 5F:
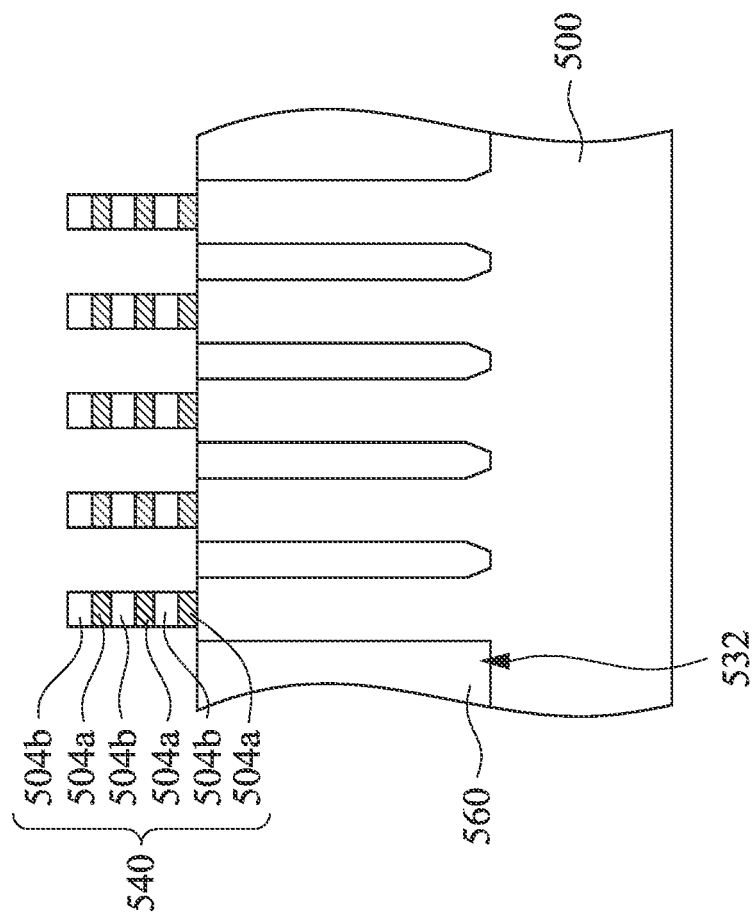

As shown in FIG. 5F, STI structures 560 are formed in the second trenches 532. Formation of the STI structures 560 may be performed by similar processes as described in FIGS. 4F-4H, and is not repeated herein.

After the STI structures 560 are formed, various operations are performed to form the semiconductor device. In some embodiments, the operations includes formation of a dummy gate stack over the channel portions 540, formation of LDD regions, formation of gate spacers alongside the dummy gate stack, formation of source and drain structures adjacent to the gate spacers, formation of a CESL, and formation of an ILD layer.

Figure 5G:
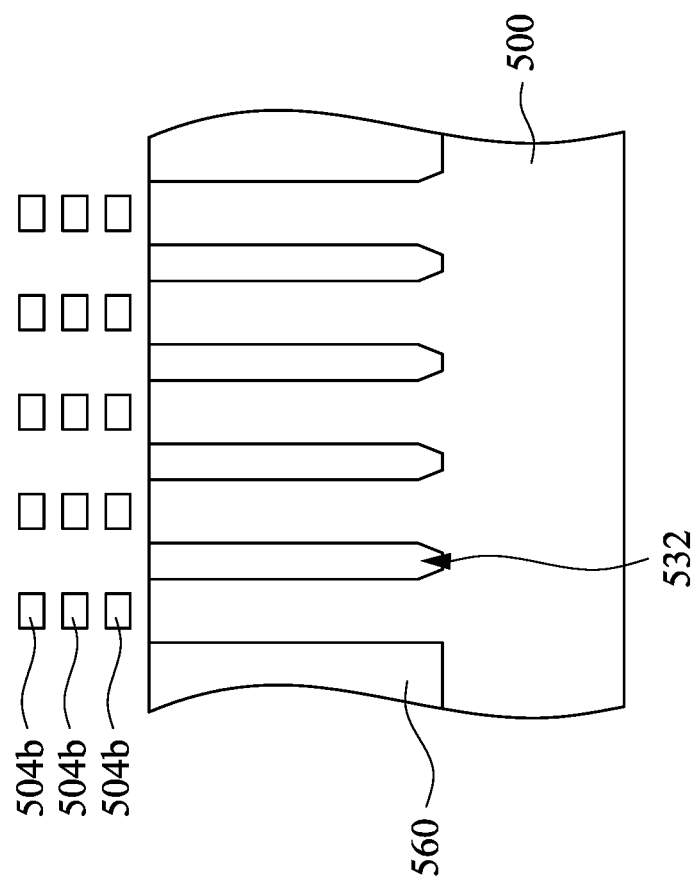

After the ILD layer is formed, the dummy gate stack is removed. Referring to FIG. 5G, a channel nanowire release operation is performed to release nanowires. In some embodiments, where the semiconductor device is configured as an n-type device (for example, having an n-channel), the first films 504a (including SiGe$_x$, Ge, or the like) in the channel portions 540 are removed, such that each of the second films 504b (including Si or the like) is released to form a nanowire. In some embodiments, where the semiconductor device is configured as a p-type device (for example, having a p-channel), the second films (including Si or the like) in the channel portions 540 are removed, such that each of the first films (including SiGe$_x$, Ge, or the like) is released to form a nanowire. In some exemplary embodiments, the first films 504a or the second films are removed by using a dry etch technique or a wet etch technique.

Figure 5H:
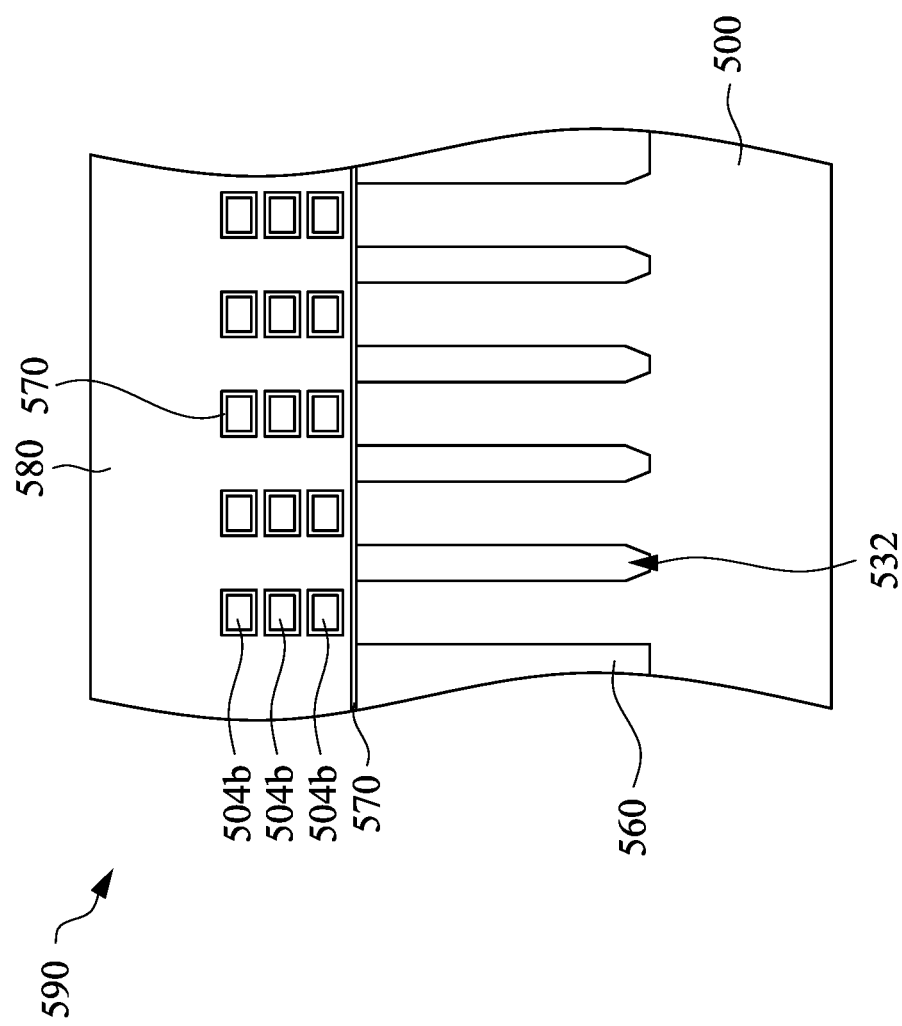

As shown in FIG. 5H, various gate dielectric layers 570 are formed to respectively wrap the second films 504b. In some embodiments, formation of the gate dielectric layers 570 includes thermal oxidation, CVD, PECVD, LPCVD, the like, or combinations thereof. In some exemplary embodiments, the gate dielectric layers 570 may include a high dielectric constant dielectric material. For example, the gate dielectric layers 570 may include HfO$_2$, ZrO$_2$, TiO$_2$, the like, or combinations thereof.

With continued reference to FIG. 5H, a gate structure 580 is formed to wrap the gate dielectric layers 570, so as to substantially complete the semiconductor device 590. The structural details and formation of the gate structure 580 are similar to that of the gate structure 480 of FIG. 4I and thus are not repeated herein.

Figure 6A:
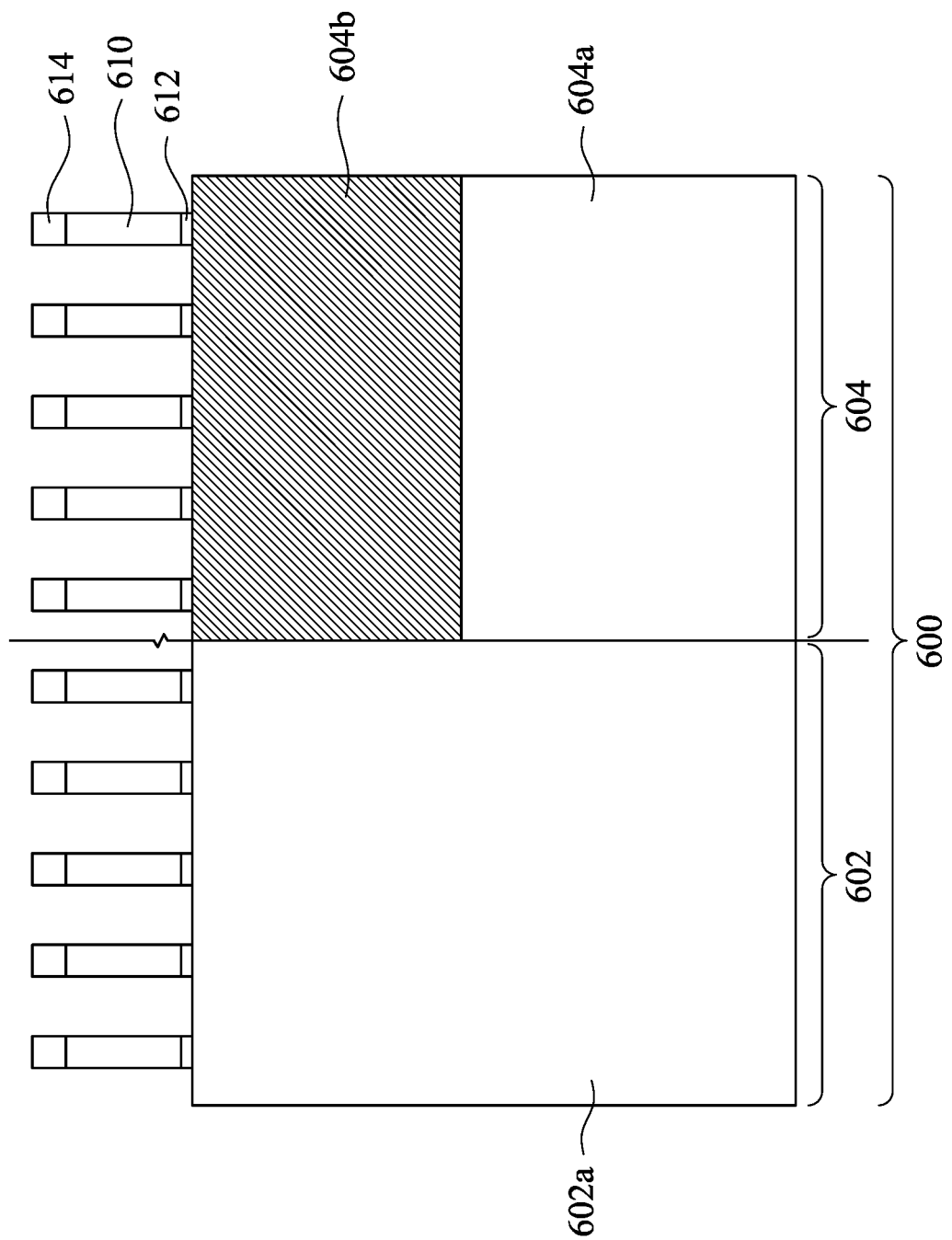
FIG. 6A through FIG. 6G are schematic cross-sectional views of intermediate stages showing a method for manufacturing a semiconductor device in accordance with various embodiments of the present disclosure.

FIG. 6A through FIG. 6G are schematic cross-sectional views of intermediate stages showing a method for manufacturing a semiconductor device in accordance with various embodiments of the present disclosure. As shown in FIG. 6A, a semiconductor substrate 600 is provided. In some embodiments, the semiconductor substrate 600 includes a first region 602 and a second region 604. The first region 602 may adjoin the second region 604, or may be separated from the second region 604 by a certain distance. In some exemplary embodiments, a first portion 602a of the semiconductor substrate 600 in the first region 602 is a single-layered structure. The semiconductor substrate 600 may include a single-crystalline semiconductor material or a compound semiconductor material. For example, the semiconductor substrate 600 may include Si, Ge, SiGeSn, a III-V compound, Si$_x$Ge$_{1-x}$, where 1>x>0, or the like.

In some embodiments, a second portion 604a of the semiconductor substrate 600 in the second region 604 is etched, and an epitaxy structure 604b is epitaxial grown over the etched second portion 604a of the semiconductor substrate 600. The epitaxy structure 604b and the semiconductor substrate 600 include different materials. For example, the semiconductor substrate 600 may include Si, and the epitaxy structure 604b may include SiGe$_x$ or Ge. In some embodiments, a patterned buffer layer 612, a patterned hard mask 610, and a patterned protective layer 614 are formed over the first portion 602a of the semiconductor substrate 600 and the epitaxy structure 604b. Formation of the patterned buffer layer 612, the patterned hard mask 610, and the patterned protective layer 614 is similar to that of the patterned buffer layer 412, the patterned hard mask 410, and the patterned protective layer 414 of FIG. 4A and thus is not repeated herein.

Figure 6B:
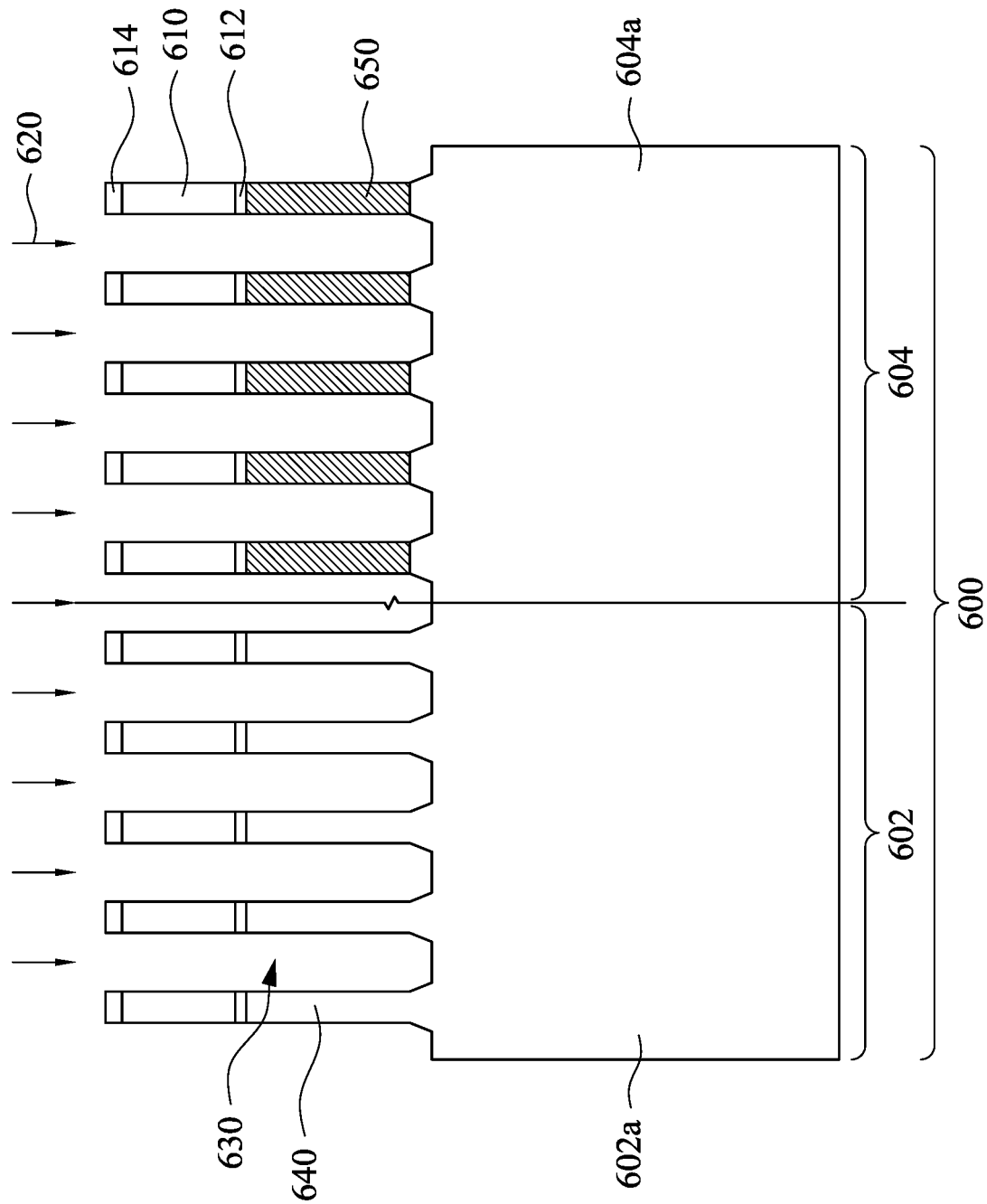

As shown in FIG. 6B, a first etching operation 620 is performed on the semiconductor substrate 600 and the epitaxy structure 604b. The first etching operation 620 is performed to remove portions of the first portion 602a of the semiconductor substrate 600 and the epitaxy structure 604b to form various first trenches 630, thereby defining various channel portions 640 and 650. This first etching operation 620 may be performed in a similar manner as described in the first etching operation 420 of FIG. 4B, and is not repeated herein.

Figure 6C:
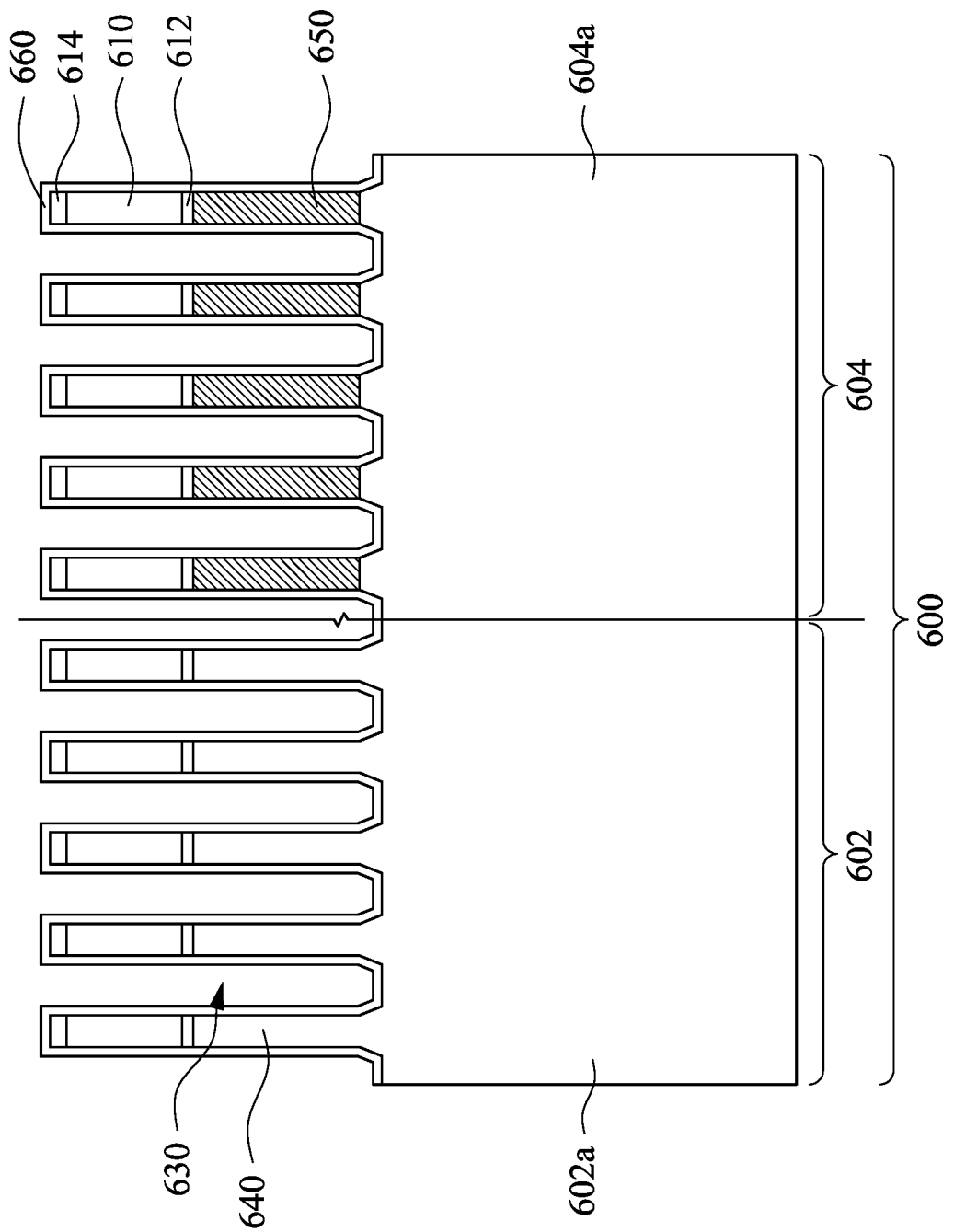

As shown in FIG. 6C, a hard mask layer 660 is formed conformally over the patterned protective layer 614, the patterned hard mask 610, the patterned buffer layer 612, the channel portions 640 and 650, and the semiconductor substrate 600. In some embodiments, the hard mask layer 660 is formed over sidewalls of the channel portions 640 and 650 to protect the sidewalls of the channel portions 640 and 650 from being etched by the following second etching operation 622 (see FIG. 6D). The structural details and formation of the hard mask layer 660 are similar to that of the hard mask layer 450 of FIG. 4C and thus are not repeated herein.

Figure 6D:
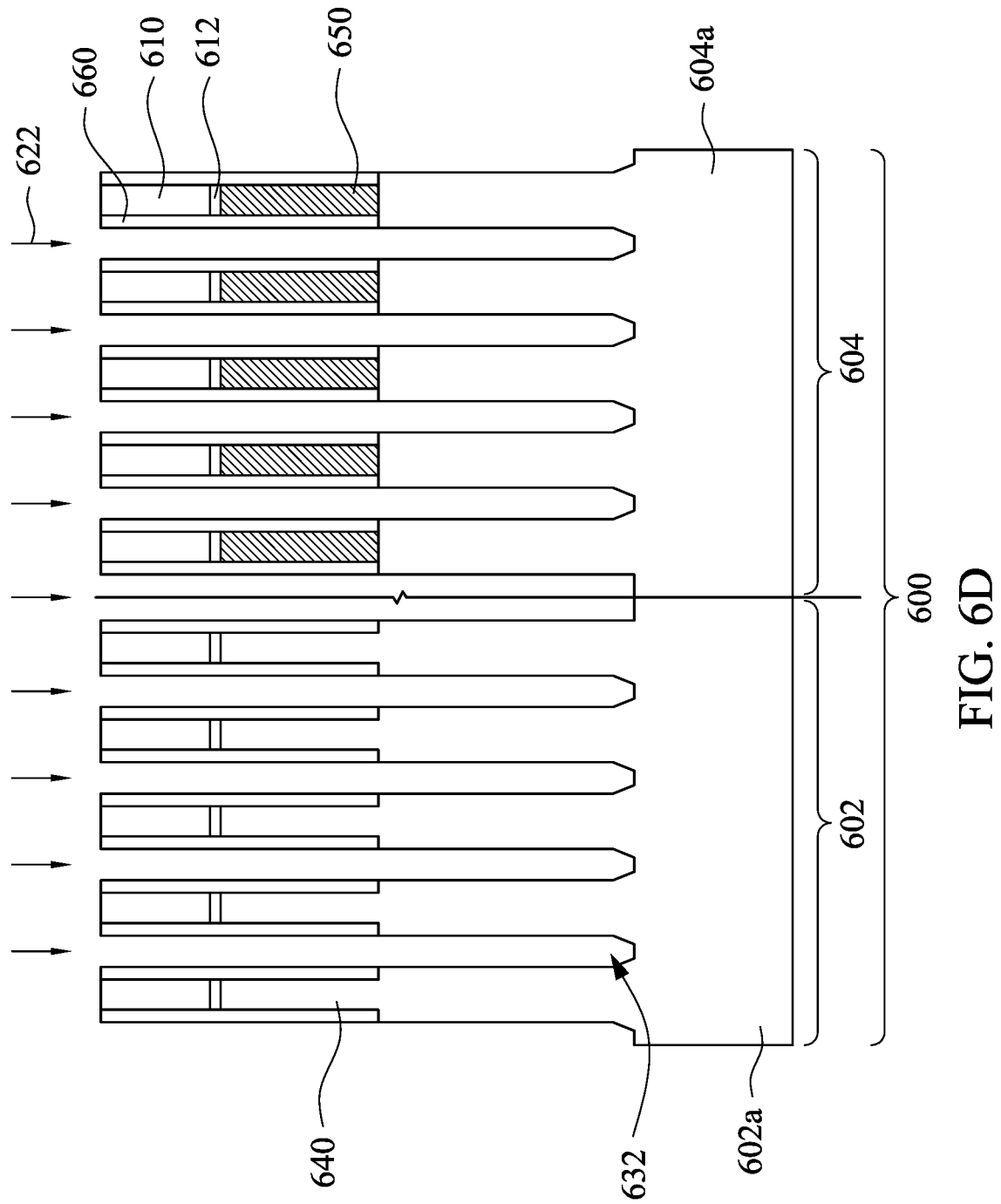

As shown in FIG. 6D, a second etching operation 622 is performed on the hard mask layer 660 and bottoms of the first trenches 630 to remove portions of the hard mask layer 660 and portions of the semiconductor substrate 600, so as to respectively deepen the first trenches 630 to be formed as various second trenches 632. This second etching operation 622 may be performed in a similar manner as described in the second etching operation 422 of FIG. 4D, and is not repeated herein.

Figure 6E:
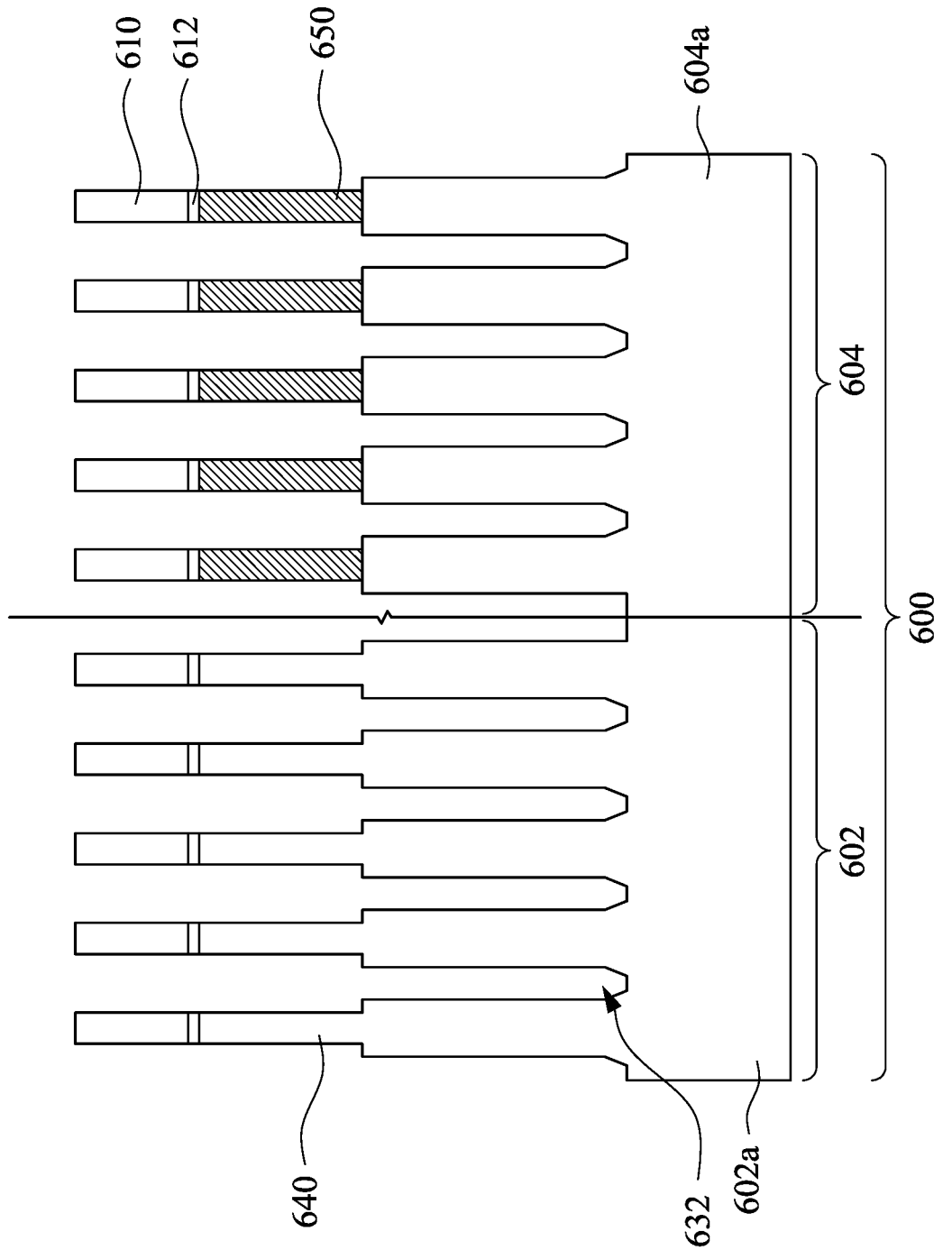

In some embodiments, as shown in FIG. 6E, the remaining portions of the hard mask layer 660 are removed to expose the sidewalls of the channel portions 640 and 650, and of the patterned hard mask 610 and the patterned buffer layer 612 corresponding to the each of the channel portions 640 and 650. The remaining portions of the hard mask layer 660 may be removed by using, for example, a dry etch method or a wet etch method.

Figure 6F:
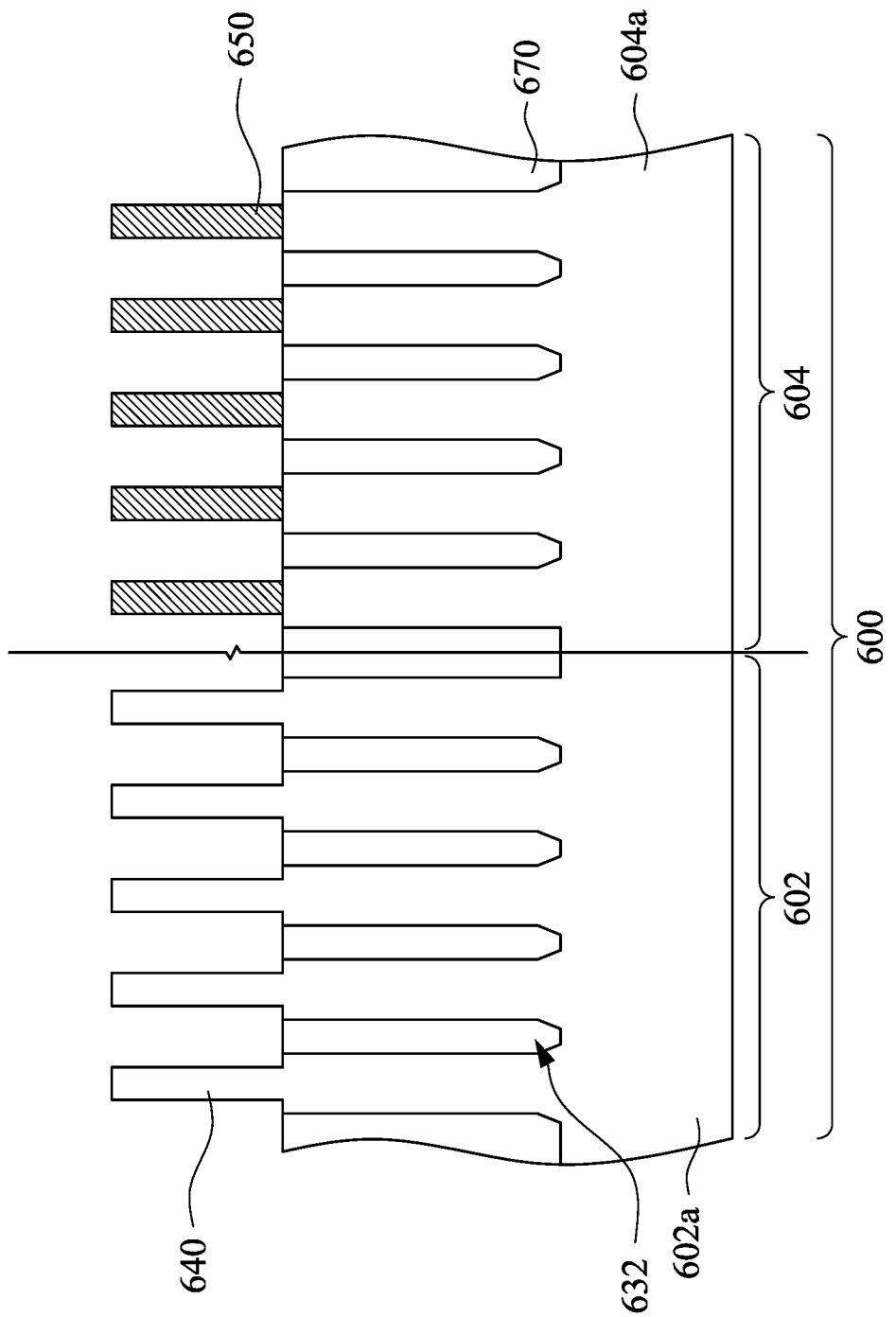

As shown in FIG. 6F, STI structures 670 are formed in the second trenches 632. Formation of the STI structures 670 may be performed by similar processes as described in FIGS. 4F-4H, and is not repeated herein.

After the STI structures 670 are formed, various operations are performed to form the semiconductor device. In some embodiments, the operations includes formation of dummy gate stacks over the channel portions 640 and 650, formation of LDD regions, formation of gate spacers alongside the dummy gate stacks, formation of source and drain structures adjacent to the gate spacers, formation of a CESL, and formation of an ILD layer.

Figure 6G:
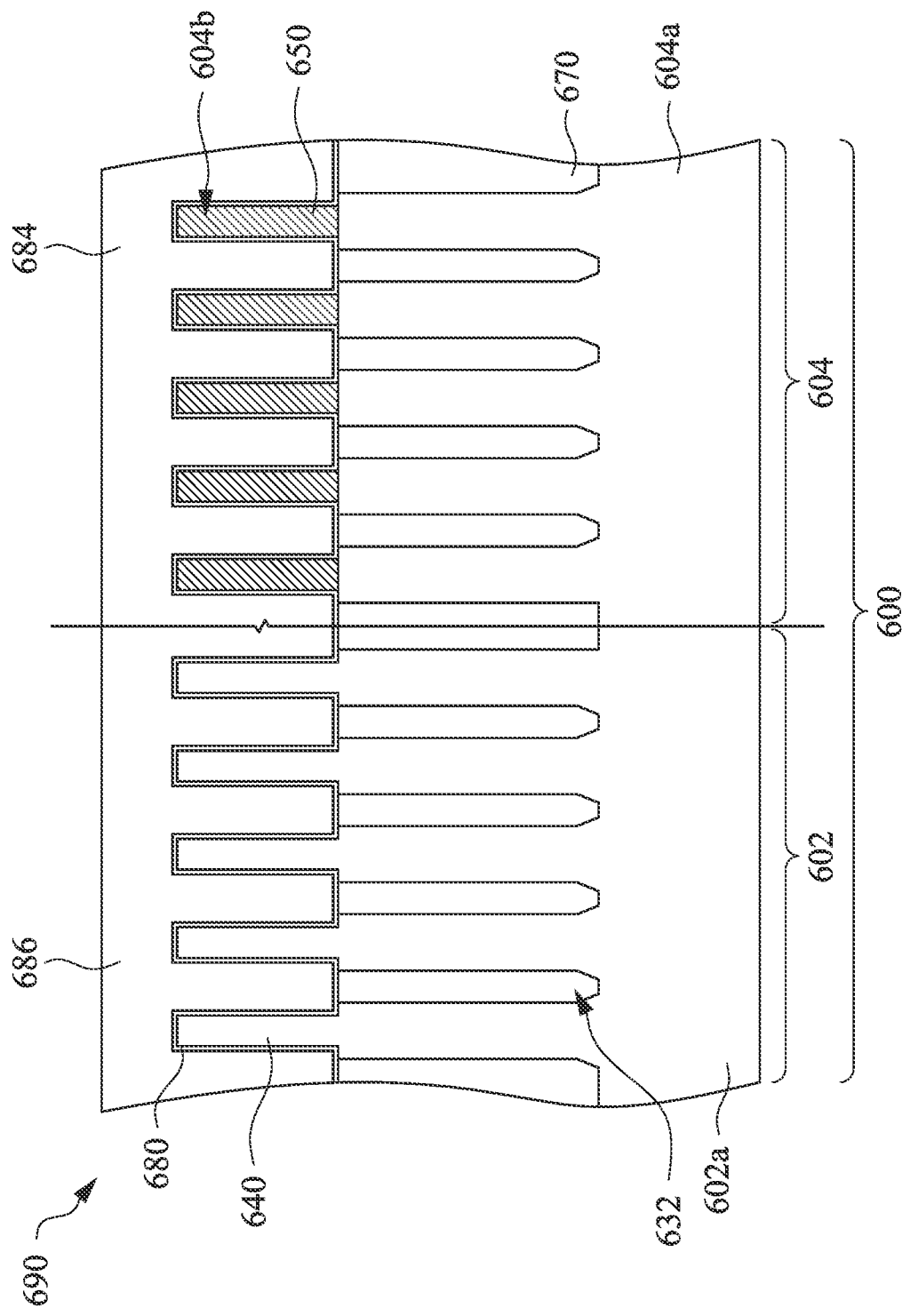

After the ILD layer is formed, the dummy gate stacks are removed. As shown in FIG. 6G, a gate dielectric layer 680 is formed over the sidewalls and top surfaces of the channel portions 640 and 650. The structural details and formation of the gate dielectric layer 680 are similar to that of the gate dielectric layer 470 of FIG. 4I and thus are not repeated herein.

First and second gate structures 684 and 686 are formed respectively over the channel portions 650 and the channel portions 640. The first and second gate structures 684 and 686 may be formed using CVD, PVD, ALD, plating, other suitable processes, or combinations thereof. The first and second gate structures 684 and 686 may each include a work function metal layer and an additional conductive layer, such as aluminum, tungsten, other suitable materials, or combinations thereof. The work function metal layer for an NMOSFET may include tantalum, titanium aluminum, titanium aluminum nitride, other suitable materials, or combinations thereof. The work function metal layer for a PMOSFET may include titanium nitride, tantalum nitride, other suitable materials, or combinations thereof. In some embodiments, the first gate structure 684 includes a p-type work function material layer, and the second gate structure 686 includes an n-type work function material layer. That is, the first gate structure 684 is configured for a PMOSFET, and the second gate structure 686 is configured for an NMOSFET. During formation of the first and second gate structures 684 and 686, N/P patterning may be implemented to separate one type of device from the other, and vice versa. A CMP process may then be performed to planarize the semiconductor device 690.

Figure 7:
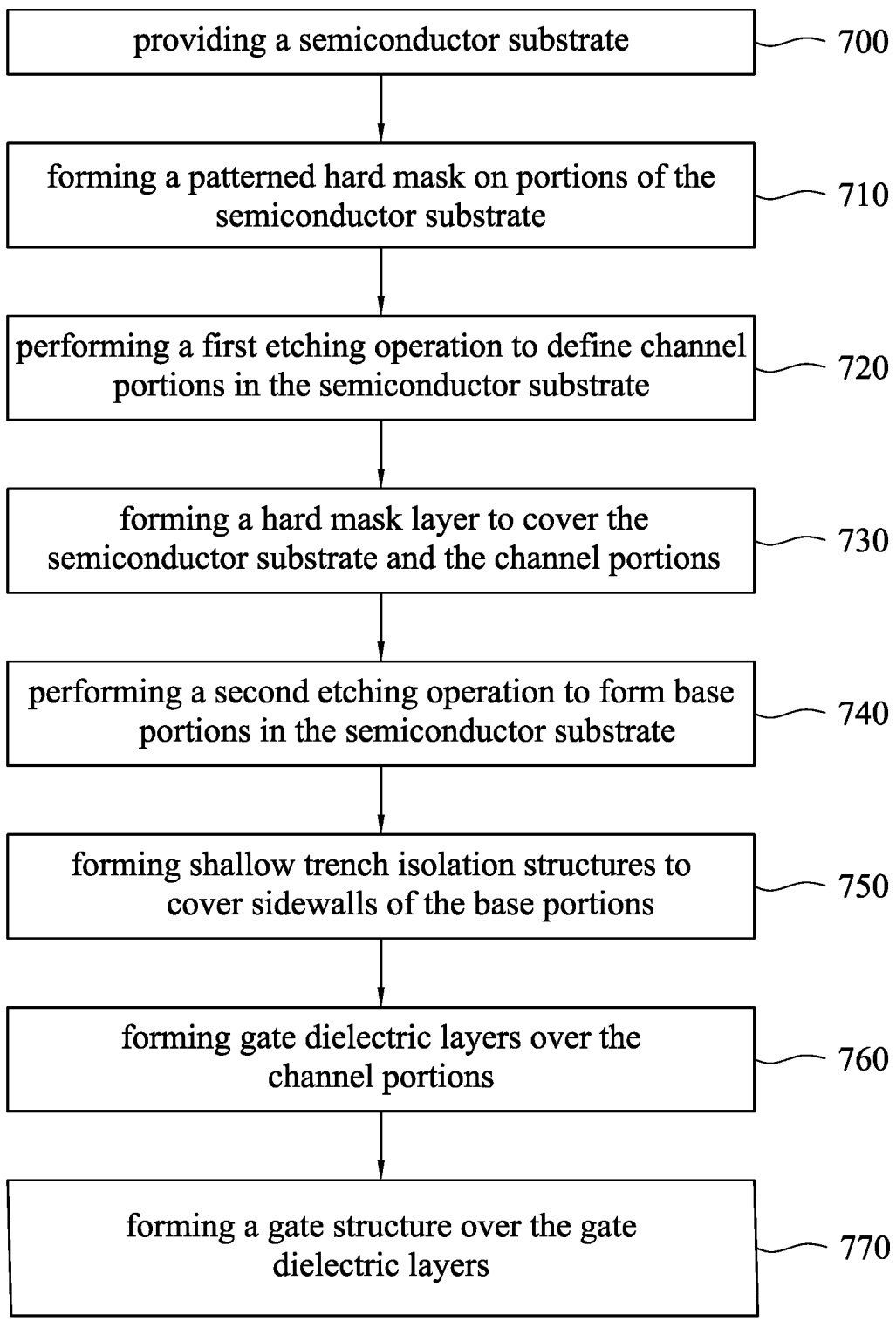
FIG. 7 is a flow chart of a method for manufacturing a semiconductor device in accordance with various embodiments of the present disclosure.

FIG. 7 is a flow chart of a method for manufacturing a semiconductor device in accordance with various embodiments of the present disclosure. The method begins with operation 700, in which a semiconductor substrate is provided. The method continues with operation 710, in which a patterned hard mask is formed over the semiconductor substrate. The method continues with operation 720, in which a first etching operation is performed on the semiconductor substrate to form various first trenches in the semiconductor substrate, so as to define various channel portions. Subsequently, operation 730 is performed. A hard mask layer is formed conformally over the channel portions. The method continues with operation 740, in which a second etching operation is performed to form various base portions. The method continues with operation 750, in which the STI structures are formed around the base portions. The method continues with operation 760, in which a gate dielectric layer is formed over the channel portions. Subsequently, operation 770 is performed. A gate structure is formed over the gate dielectric layer.

Figure 8:
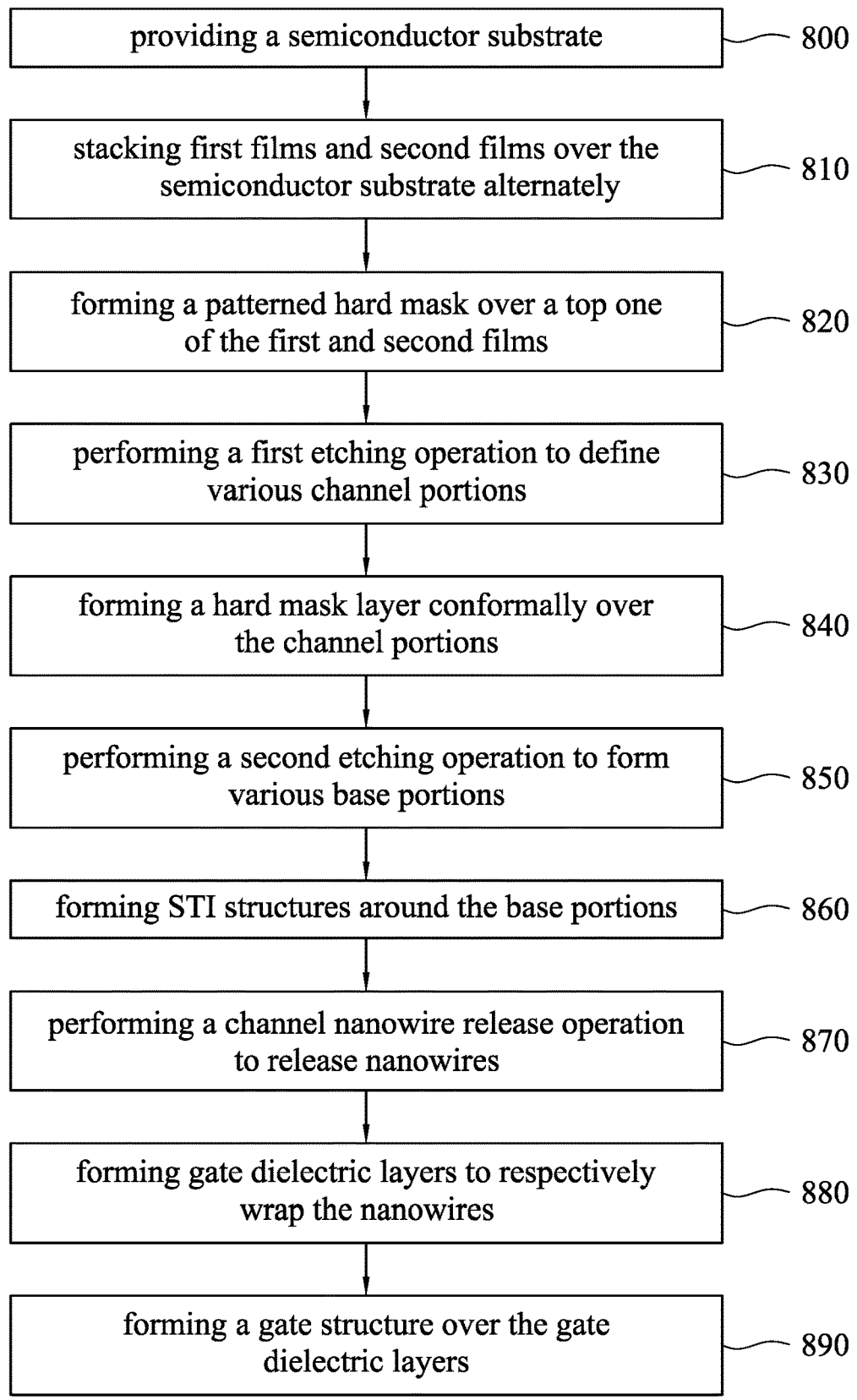
FIG. 8 is a flow chart of a method for manufacturing a semiconductor device in accordance with various embodiments of the present disclosure.

FIG. 8 is a flow chart of a method for manufacturing a semiconductor device in accordance with various embodiments of the present disclosure. The method begins with operation 800, in which a semiconductor substrate is provided. The method continues with operation 810, in which first films and second films are alternately stacked over the semiconductor substrate in sequence. The method continues with operation 820, in which a patterned hard mask is formed over a top one of the first and second films. The method continues with operation 830, in which a first etching operation is performed on the first and second films and the semiconductor substrate to form various first trenches, so as to define various channel portions. Subsequently, operation 840 is performed. A hard mask layer is formed conformally over the channel portions. The method continues with operation 850, in which a second etching operation is performed to form various base portions. The method continues with operation 860, in which the STI structures are formed around the base portions. The method continues with operation 870, in which a channel nanowire release operation is performed to release nanowires. The method continues with operation 880, in which gate dielectric layers are formed to respectively wrap the nanowires. Subsequently, operation 890 is performed. A gate structure is formed over the gate dielectric layers.

Figure 9:
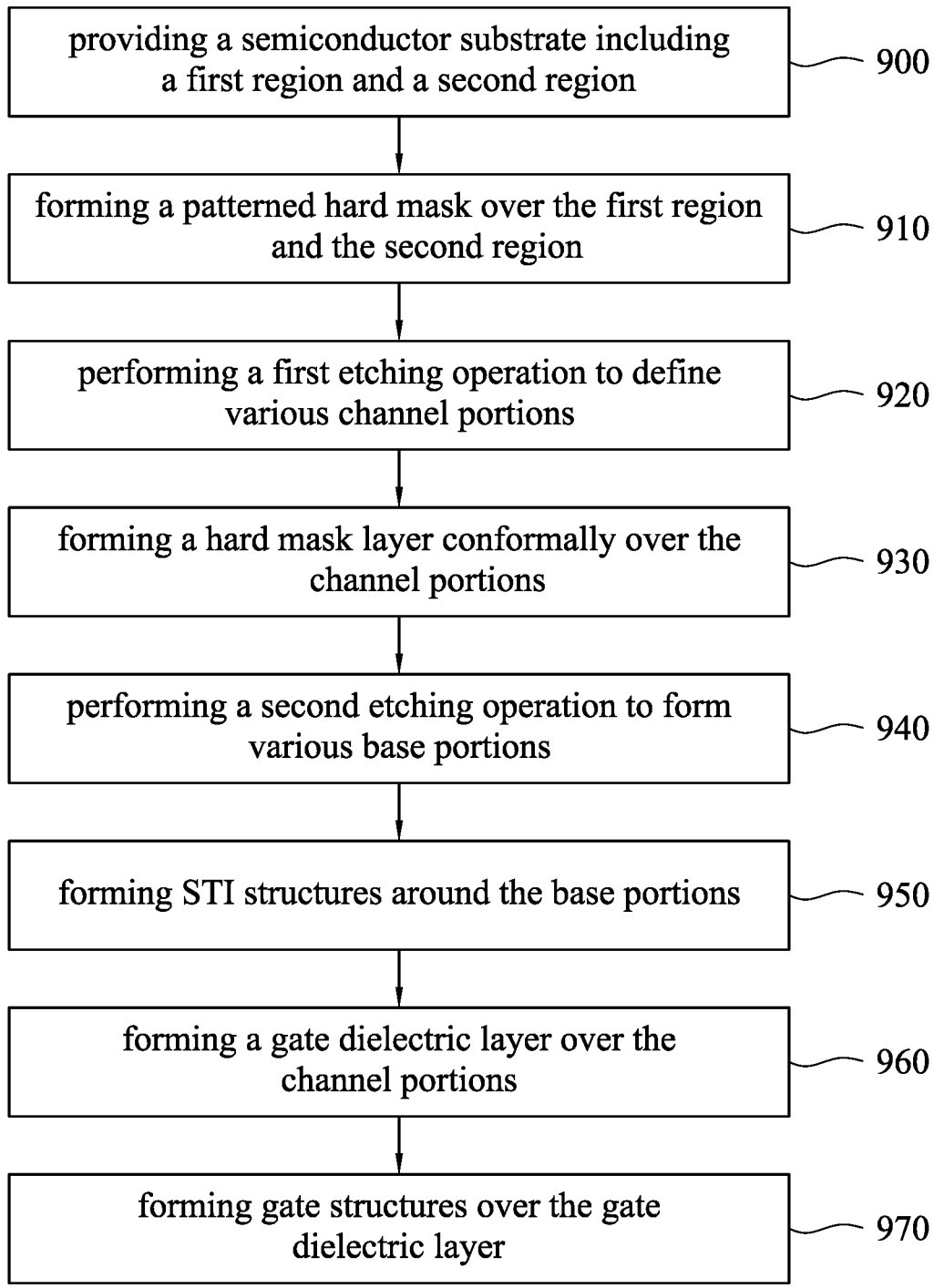
FIG. 9 is a flow chart of a method for manufacturing a semiconductor device in accordance with various embodiments of the present disclosure.

FIG. 9 is a flow chart of a method for manufacturing a semiconductor device in accordance with various embodiments of the present disclosure. The method begins with operation 900, in which a semiconductor substrate including a first region and a second region is provided. The method continues with operation 910, in which a patterned hard mask is formed over the first region and the second region of the semiconductor substrate. The method continues with operation 920, in which a first etching operation is performed on the first region and the second region of the semiconductor substrate to form various first trenches, so as to define various channel portions. Subsequently, operation 930 is performed. A hard mask layer is formed conformally over the channel portions. The method continues with operation 940, in which a second etching operation is performed to form various base portions. The method continues with operation 950, in which the STI structures are formed around the base portions. The method continues with operation 960, in which a gate dielectric layer is formed over the channel portions. Subsequently, operation 970 is performed. Gate structures are formed over the gate dielectric layer, in which the gate structures are respectively over the first region and the second region of the semiconductor substrate.

The hard mask layer can protect the sidewalls of the channel portions from being etched during the second etching operation, such that the profile of each of the channel portions is kept intact, thereby forming each of the channel portions having a substantially straight profile. Moreover, the rate of the second etching operation can also be increased without concern about damaging the sidewalls of the channel portions, thus reducing an operation time of the second etching operation.

In accordance with an embodiment, the present disclosure discloses a method. In this method, a semiconductor substrate is etched to form a trench, such that the trench defines a channel portion. A hard mask layer is deposited over sidewalls of the channel portion. The semiconductor substrate is anisotropically etched to deepen the trench, such that the deepened trench further defines a base portion under the channel portion and the hard mask layer. The hard mask layer is removed from the sidewalls of the channel portion. The deepened trench is filled with an isolation material. The isolation material is recessed to form an isolation structure, in which the channel portion protrudes from the isolation structure. In accordance with another embodiment, the present disclosure discloses a method. In this method, a first film is epitaxially grown over a semiconductor substrate and a second film over the first film. The first film and the second film are etched to form a channel portion, in which the channel portion has the etched first film and the etched second film. A hard mask layer is deposited over sidewalls of the channel portion. The semiconductor substrate is anisotropically etched to form a base portion under the channel portion and the hard mask layer. The hard mask layer is removed from the sidewalls of the channel portion. An isolation structure is formed around the base portion. The etched first film is removed from the channel portion.

In accordance with yet another embodiment, the present disclosure discloses a device. The device includes a semiconductor substrate, an isolation structure, a gate dielectric layer, and a gate structure. The semiconductor substrate has a protrusion structure, in which the protrusion structure has a base portion and a channel portion over the base portion, a width of the base portion is greater than a width of the channel portion, and a difference between the width of the base portion and the width of the channel portion is in a range from about 0.2 nm to about 20 nm. The isolation structure is around the base portion of the protrusion structure, in which the channel portion of the protrusion structure protrudes from a top surface of the isolation structure. The gate dielectric layer is over the channel portion of the protrusion structure. The gate structure is over the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a patterned hard mask and a patterned protective layer over a semiconductor substrate;
    etching a semiconductor substrate by using the patterned hard mask and the patterned protective layer as etching masks to form a trench, such that the trench defines a channel portion;
    depositing a hard mask layer over sidewalls of the channel portion and covering the patterned hard mask and the patterned protective layer such that a thickness of the hard mask layer is in a range from about 0.1 nm to about 10 nm;
    anisotropically etching the semiconductor substrate to deepen the trench, such that the deepened trench further defines a base portion under the channel portion and the hard mask layer, wherein anisotropically etching the semiconductor substrate comprises removing the patterned protective layer to expose the patterned hard mask;
    removing the hard mask layer from the sidewalls of the channel portion;
    filling the deepened trench with an isolation material; and
    recessing the isolation material to form an isolation structure, wherein the channel portion protrudes from the isolation structure.

2. The method of claim 1, wherein depositing the hard mask layer is performed such that the hard mask layer is deposited over a bottom of the trench.

3. The method of claim 2, further comprising:
    etching the hard mask layer over the bottom of the trench prior to anisotropically etching the semiconductor substrate.

4. The method of claim 1, wherein anisotropically etching the semiconductor substrate is performed such that a top surface of the base portion is in contact with a bottom surface of the hard mask layer.

5. The method of claim 1, wherein etching the semiconductor substrate to form the trench is performed in a chamber the same as that for depositing the hard mask layer.

6. The method of claim 1, wherein the patterned protective layer is removed prior to removing the hard mask layer.

7. The method of claim 1, wherein the semiconductor substrate comprises a first semiconductive layer and a second semiconductive layer over the first semiconductive layer, the first and second semiconductive layers comprise different materials, etching the semiconductor substrate is such that the second semiconductive layer is etched and a top surface of the first semiconductive layer is exposed, and anisotropically etching the semiconductor substrate is such that the first semiconductive layer is anisotropically etched.

8. A method, comprising:
    epitaxially growing a first film over a semiconductor substrate and a second film over the first film, wherein the first and second films are made of semiconductive materials;
    etching the first film and the second film to form a channel portion, wherein the channel portion has the etched first film and the etched second film;
    depositing a hard mask layer over sidewalls of the channel portion;
    anisotropically etching the semiconductor substrate to form a base portion under the channel portion and the hard mask layer such that a difference between a width of the base portion and a width of the channel portion is in a range from about 0.2 nm to about 20 nm;

removing the hard mask layer from the sidewalls of the channel portion;

forming an isolation structure around the base portion; and removing the etched first film from the channel portion.

9. The method of claim 8, wherein anisotropically etching the semiconductor substrate is performed such that a top surface of the base portion is in contact with a bottom surface of the hard mask layer.

10. The method of claim 8, further comprising:

depositing a hard mask over the second film; and etching the hard mask to form a patterned hard mask over the second film, wherein depositing the hard mask layer is performed such that the hard mask layer is deposited over the patterned hard mask.

11. The method of claim 8, wherein depositing the hard mask layer is performed such that the hard mask layer is deposited over a top surface of the semiconductor substrate.

12. The method of claim 11, further comprising:

etching the hard mask layer over the top surface of the semiconductor substrate prior to anisotropically etching the semiconductor substrate.

13. The method of claim 8, further comprising forming a gate structure to wrap around the etched second film.

14. A device, comprising:

a semiconductor substrate having a protrusion structure, wherein the protrusion structure has a base portion and a channel portion over and spaced from the base portion such that the channel portion is not in contact with the base portion, a width of the base portion is greater than a width of the channel portion, and a difference between the width of the base portion and the width of the channel portion is in a range from about 0.2 nm to about 20 nm;

an isolation structure around the base portion of the protrusion structure, wherein the channel portion of the protrusion structure protrudes from a top surface of the isolation structure;

a gate dielectric layer over the channel portion of the protrusion structure; and a gate structure over the gate dielectric layer.

15. The device of claim 14, wherein the protrusion structure has a stepped sidewall.

16. The device of claim 14, wherein the gate dielectric layer wraps around the channel portion of the protrusion structure.

17. The device of claim 14, wherein a portion of the gate structure is between the channel portion and the base portion.

18. The device of claim 14, wherein the gate dielectric layer is in contact with a top surface of the base portion.

19. The device of claim 14, wherein the channel portion and the base portion of the protrusion structure are made of the same material.

20. The device of claim 14, wherein the gate dielectric layer is in contact with a bottom surface of the channel portion.

* * * * *